(12) United States Patent
Okumura et al.

(10) Patent No.: US 10,840,340 B2
(45) Date of Patent: Nov. 17, 2020

(54) SILICON CARBIDE SEMICONDUCTOR DEVICE AND SILICON CARBIDE SEMICONDUCTOR CIRCUIT DEVICE

(71) Applicant: FUJI ELECTRIC CO., LTD., Kawasaki (JP)

(72) Inventors: Keiji Okumura, Matsumoto (JP); Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/254,834

(22) Filed: Jan. 23, 2019

(65) Prior Publication Data

US 2019/0288073 A1  Sep. 19, 2019

(30) Foreign Application Priority Data

Mar. 14, 2018 (JP) ................................. 2018-047322

(51) Int. Cl.
| | | |
|---|---|---|
| *H01L 29/16* | (2006.01) | |
| *H01L 29/51* | (2006.01) | |
| *H01L 29/08* | (2006.01) | |
| *H01L 29/78* | (2006.01) | |
| *H01L 29/423* | (2006.01) | |

(52) U.S. Cl.
CPC ...... *H01L 29/1608* (2013.01); *H01L 29/0865* (2013.01); *H01L 29/4236* (2013.01); *H01L 29/517* (2013.01); *H01L 29/7803* (2013.01); *H01L 29/7813* (2013.01)

(58) Field of Classification Search
CPC ............. H01L 29/1608; H01L 29/0865; H01L 29/4236; H01L 29/517; H01L 29/7803; H01L 29/7813; H01L 29/66325–66348; H01L 29/086; H01L 29/1095; H01L 29/7805

See application file for complete search history.

(56) References Cited

U.S. PATENT DOCUMENTS

| | | | | |
|---|---|---|---|---|
| 4,937,722 | A * | 6/1990 | Deierlein ............... | H02M 3/156 323/285 |
| 2013/0330896 | A1* | 12/2013 | Miyahara .......... | H01L 29/66068 438/270 |
| 2016/0181408 | A1 | 6/2016 | Aichinger et al. | |
| 2017/0133504 | A1* | 5/2017 | Shiomi ............... | H01L 21/0465 |

FOREIGN PATENT DOCUMENTS

JP        2016-129226 A        7/2016

* cited by examiner

*Primary Examiner* — Shahed Ahmed

(57) ABSTRACT

In a MOS silicon carbide semiconductor device and a silicon carbide semiconductor circuit device equipped with the silicon carbide semiconductor device, a gate leak current that flows when negative voltage with respect to the potential of the source electrode is applied to the gate electrode is limited to less than $2\times10^{-11}$ A. The negative voltage applied to the gate electrode is limited to $-3$V or lower relative to the potential of the source electrode.

18 Claims, 15 Drawing Sheets

FIG.16
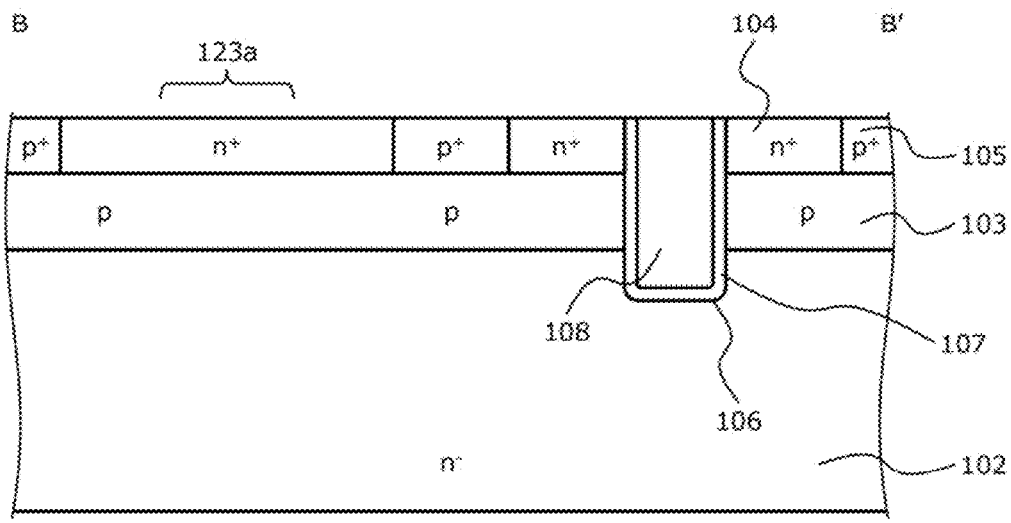
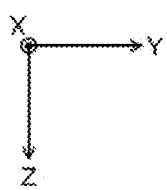
FIG.17
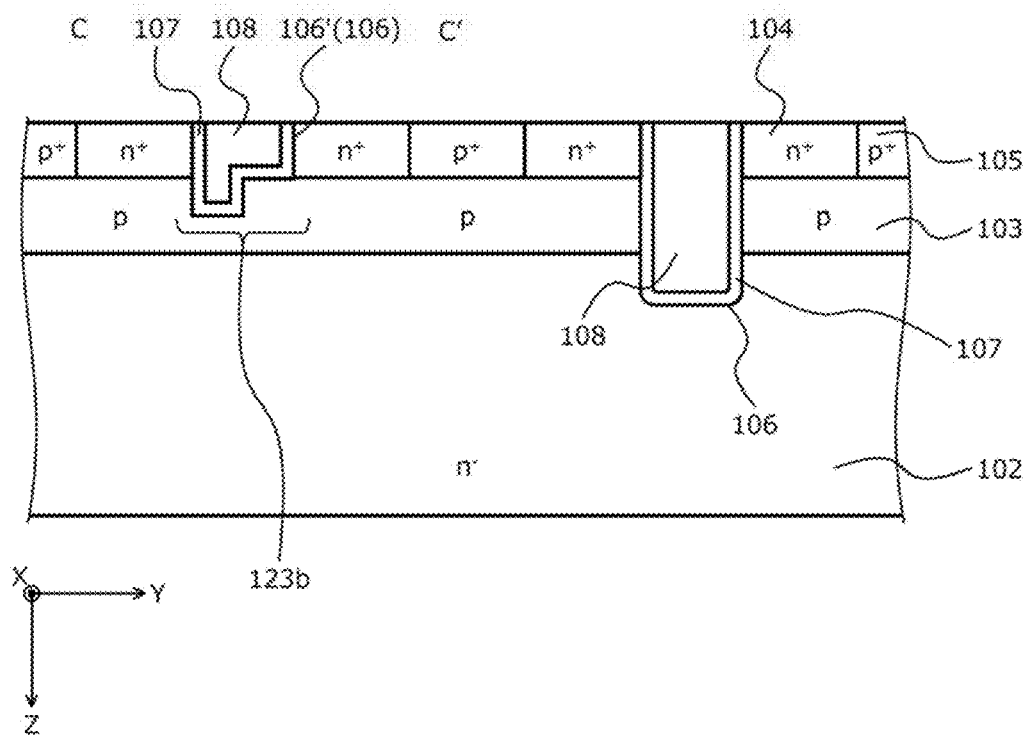

SILICON CARBIDE SEMICONDUCTOR DEVICE AND SILICON CARBIDE SEMICONDUCTOR CIRCUIT DEVICE

CROSS REFERENCE TO RELATED APPLICATIONS

This application is based upon and claims the benefit of priority of the prior Japanese Patent Application No. 2018-047322, filed on Mar. 14, 2018, the entire contents of which are incorporated herein by reference.

BACKGROUND

1. Field

Embodiments of the invention relate to a silicon carbide semiconductor device and a silicon carbide semiconductor circuit device.

2. Description of Related Art

Silicon carbide (SiC) having higher dielectric breakdown field strength than silicon (Si) has been gaining attention recently as an optimal semiconductor material for low-loss power devices. Further, for silicon carbide, similarly to silicon, since an oxide film ($SiO_2$ film) may be formed on a semiconductor substrate, development is advancing with respect to a power metal oxide semiconductor field effect transistor (MOSFET) that uses an oxide film as a gate insulating film and that is a MOS field effect transistor having an insulated gate that has a 3-layer structure including a metal, an oxide film, and a semiconductor.

As one conventional MOSFET, a device has been proposed that includes a trench gate structure disposed in a striped layout where linear parts having an end are parallel to each other; a gate connector structure having at least one among a gate runner, a gate finger, and a gate pad electrically connected to a gate electrode in the trench gate structure; and a gate dielectric that separates the gate electrode from a semiconductor body and that is a thermally grown or deposited semiconductor oxide (for example, refer to Japanese Laid-Open Patent Publication No. 2016-129226 (paragraphs 0028 to 0030, and FIGS. 1A, 1B, 2, and 5A)).

In Japanese Laid-Open Patent Publication No. 2016-129226, a first part of the gate dielectric on an outer side of a vertical protrusion of the gate connector structure is thinner than a second part of the gate dielectric on an inner side of the vertical protrusion of the gate connector structure, whereby reliability of the device overall is improved. Further, in Japanese Laid-Open Patent Publication No. 2016-129226, a structure is disclosed in which a contact hole is provided near a center of the trench gate structure extending linearly, parallel to a main surface of the semiconductor substrate, and through this contact hole, the gate electrode and the gate finger are connected.

SUMMARY

According to an embodiment of the present invention a silicon carbide semiconductor device includes a first-conductivity-type semiconductor layer of a first conductivity type and having a first main surface and a second main surface; a first semiconductor region of a second conductivity type selectively provided in a surface layer at the first main surface of the first-conductivity-type semiconductor layer; a second semiconductor region of the first conductivity type, the second semiconductor region being a part of the first-conductivity-type semiconductor layer excluding the first semiconductor region; a third semiconductor region of the first conductivity type selectively provided in the first semiconductor region; a gate insulating film provided in contact with a region of the first semiconductor region between the second semiconductor region and the third semiconductor region; a gate electrode provided opposing the first semiconductor region, across the gate insulating film; a first electrode electrically connected to the first semiconductor region and the third semiconductor region; and a second electrode electrically connected to the second semiconductor region. A gate leak current that flows when negative voltage applied to the gate electrode is limited to less than $2 \times 10^{-11}$ A, the negative voltage being negative relative to a potential of the first electrode.

In the embodiment, the gate leak current is limited to less than $3.7 \times 10^{-6}$ $A/m^2$.

In the embodiment, the gate insulating film has a total mathematical area that is less than 3.86 $mm^2$.

In the embodiment, positive voltage applied to the first electrode is limited in magnitude to 3V or lower relative to a potential of the gate electrode.

In the embodiment, electric field applied to the gate insulating film is limited to 0.42 MV/cm or lower.

In the embodiment, a thickness of the gate insulating film is thicker than 72 nm.

In the embodiment, the gate insulating film is a deposited film or a stacked film having the deposited film as one layer. The gate electrode is disposed in a striped layout extending along a first direction parallel to the first main surface of the first-conductivity-type semiconductor layer. The gate electrode has a first end fixed at a gate potential and a second end at a floating potential.

In the embodiment, the gate electrode is disposed in plural, in a layout in which the first ends of the gate electrodes are adjacent to each other in a second direction that is orthogonal to the first direction and are coupled to each other and the second ends of the gate electrodes are adjacent to each other in the second direction and are positioned separated from each other.

In the embodiment, the deposited film is a high temperature oxide film.

In the embodiment, the gate electrode contains polysilicon.

According to another embodiment of the present invention, a silicon carbide semiconductor device includes a first-conductivity-type semiconductor layer of a first conductivity type and having a first main surface and a second main surface; a first semiconductor region of a second conductivity type selectively provided in a surface layer at the first main surface of the first-conductivity-type semiconductor layer; a second semiconductor region of the first conductivity type, the second semiconductor region being a part of the first-conductivity-type semiconductor layer excluding the first semiconductor region; a third semiconductor region of the first conductivity type selectively provided in the first semiconductor region; a gate insulating film provided in contact with a region of the first semiconductor region between the second semiconductor region and the third semiconductor region; a gate electrode provided opposing the first semiconductor region, across the gate insulating film; a first electrode electrically connected to the first semiconductor region and the third semiconductor region; and a second electrode electrically connected to the second semiconductor region. Negative voltage applied to the gate electrode is limited to −3V or higher relative to a potential of the first electrode.

According to another embodiment of the present invention, a silicon carbide semiconductor circuit device includes a silicon carbide semiconductor device that includes: a first-conductivity-type semiconductor layer of a first conductivity type and having a first main surface and a second main surface; a first semiconductor region of a second conductivity type selectively provided in a surface layer at the first main surface of the first-conductivity-type semiconductor layer; a second semiconductor region of the first conductivity type, the second semiconductor region being a part of the first-conductivity-type semiconductor layer excluding the first semiconductor region; a third semiconductor region of the first conductivity type selectively provided in the first semiconductor region; a gate insulating film provided in contact with a region of the first semiconductor region between the second semiconductor region and the third semiconductor region; a gate electrode provided opposing the first semiconductor region, across the gate insulating film; a first electrode electrically connected to the first semiconductor region and the third semiconductor region; and a second electrode electrically connected to the second semiconductor region. A gate leak current that flows when negative voltage applied to the gate electrode is limited to less than $2\times10^{-11}$ A, the negative voltage being negative relative to a potential of the first electrode. The gate leak current is limited by a load connected to the gate electrode.

In the embodiment, the load is a resistor, a capacitor, or an inductor.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 16 is a cross-sectional view of the structure at cutting line B-B' in FIG. 13;

FIG. 17 is a cross-sectional view of the structure at cutting line C-C' in FIG. 14;

DETAILED DESCRIPTION OF EMBODIMENTS

Figure 1:
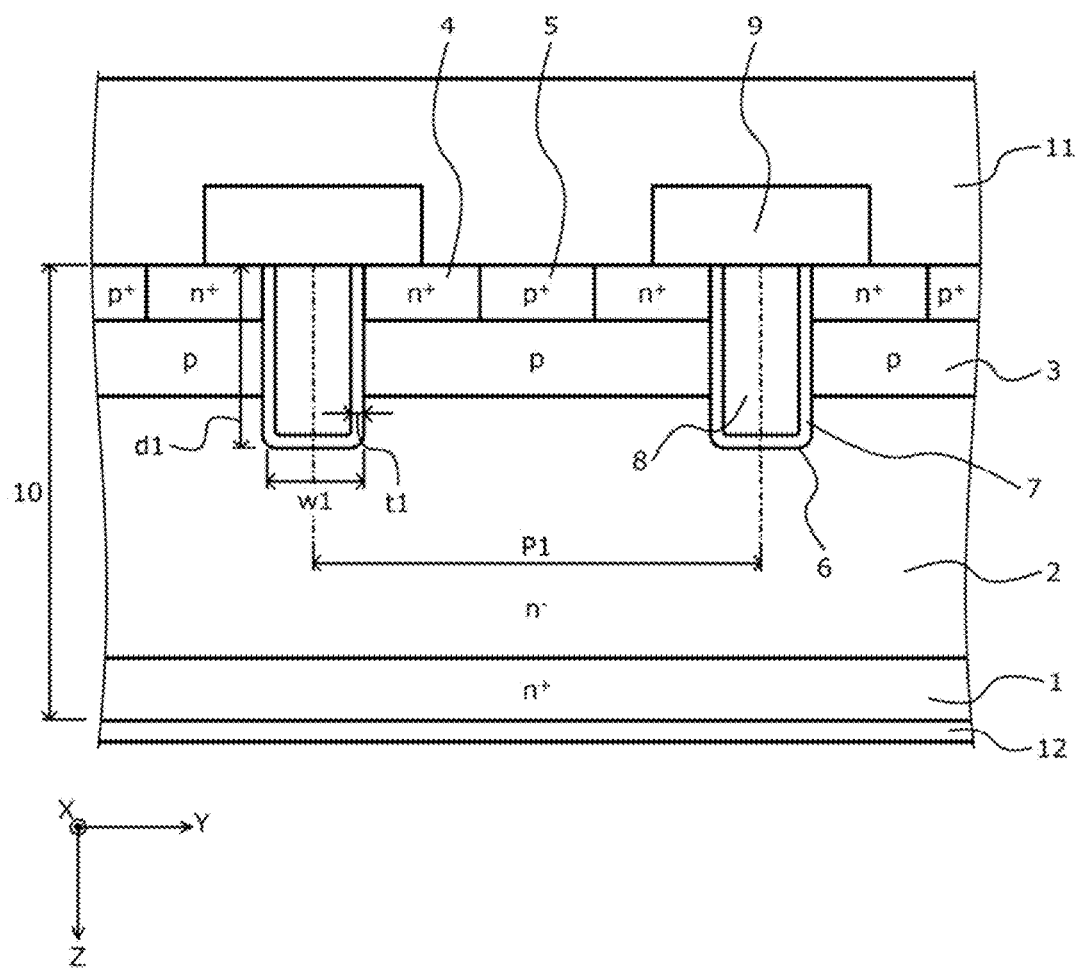
FIG. 1 is a cross-sectional view of an example of a structure of a silicon carbide semiconductor device according to a first embodiment.

First, problems associated with the related techniques will be discussed. In a MOS semiconductor device having a MOS gate, when silicon carbide is used as a semiconductor material, during actual operation, positive voltage and negative voltage relative to the potential of the source electrode are alternately applied to the gate electrode continuously, whereby the gate threshold voltage varies. In particular, when positive voltage relative to the potential of the source electrode is applied to the gate electrode, electrons are injected into the gate insulating film, whereby the gate threshold voltage varies. When negative voltage relative to the potential of the source electrode is applied to the gate electrode, holes are injected into gate insulating film, whereby the gate threshold voltage varies. Variation of the gate threshold voltage is variation from a gate threshold voltage (reference value) at the time of factory shipping, determined based on design conditions. As a result, a problem arises in that an upper limit of the voltage applied to the gate electrode is limited at an upper limit of a voltage range that does not cause variation of the gate threshold voltage.

Embodiments of a silicon carbide semiconductor device and a silicon carbide semiconductor circuit device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, regardless of whether voltage applied to a gate electrode is positive voltage or negative voltage relative to a potential of a source of a gate electrode, the voltage is indicated as Vgs. Hereinafter, Vgs and Vsg indicate to which potential the voltage is relative; for example, Vsg indicates that voltage relative to a potential of a gate is applied to a source electrode.

A structure of the silicon carbide (SiC) semiconductor device according to a first embodiment will be described taking a MOSFET as an example. FIG. 1 is a cross-sectional view of an example of the structure of the silicon carbide semiconductor device according to the first embodiment. The silicon carbide semiconductor device according to the first embodiment depicted in FIG. 1 is a vertical MOSFET having on a front surface side of a semiconductor substrate (semiconductor chip) 10 containing silicon carbide, a MOS gate having a trench gate structure. The MOS gate has a trench 6, a gate insulating film 7, and a gate electrode 8.

The semiconductor substrate 10 is an epitaxial substrate in which silicon carbide layers constituting an $n^-$-type drift region 2 and a p-type base region 3 are sequentially formed by epitaxial growth on a front surface of an $n^+$-type starting substrate that contains silicon carbide and constitutes an $n^+$-type drain region 1. The semiconductor substrate 10 has a front surface on a side with the p-type base region 3 and a rear surface (i.e., rear surface of the $n^+$-type starting substrate) on a side with the $n^+$-type drain region 1. In the p-type base region 3, an $n^+$-type source region 4 and a $p^+$-type contact region 5 are selectively provided.

On a front surface side of the semiconductor substrate 10, a part of a p-type silicon carbide layer constituting the semiconductor substrate 10, excluding the $n^+$-type source region 4 and the $p^+$-type contact region 5 is the p-type base region 3. The trench 6 penetrates the $n^+$-type source region 4 and the p-type base region 3 from the front surface of the semiconductor substrate 10 and reaches the $n^-$-type drift region 2. The trench 6 is disposed in a striped layout extending along a direction (hereinafter, first direction, viewing direction in FIG. 1) X parallel to the front surface of the semiconductor substrate 10.

The trench 6 is disposed in plural in an active region, at a predetermined interval along a direction (hereinafter, second direction) Y that is orthogonal to the first direction X and parallel to the front surface of the semiconductor substrate 10. The active region is a region through which current flows in an ON state. One MOSFET cell (unit cell: constituent unit of element) is constituted by one MOS gate provided in one trench 6. A disposal interval of the trench 6 is a cell pitch P1 of the MOSFET cells. In FIG. 1, two MOSFET cells of the plural MOSFET cells disposed in the active region are depicted.

The gate insulating film 7 is provided along a surface of a semiconductor region between the $n^+$-type source region 4 and the $n^+$-type drain region 1, the gate insulating film 7 electrically insulating the gate electrode 8 and the semiconductor region. In particular, the gate insulating film 7 is provided along an inner wall (side walls and bottom) of the trench 6, and is in contact with a region of the p-type base region 3 between the $n^-$-type drift region 2 and the $n^+$-type source region 4. The gate insulating film 7 is provided only at the inner wall of the trench 6. In other words, an end of the gate insulating film 7 toward a source electrode 11 terminates at a top of the side walls of the trench 6 and does not extend from the side walls of the trench 6 to the front surface of the semiconductor substrate 10.

The gate electrode 8 is a control electrode that controls the flow of carriers (current) between the $n^+$-type source region 4 and the $n^+$-type drain region 1. The gate electrode 8 is provided on the gate insulating film 7 in the trench 6. At the side walls of the trench 6, the gate electrode 8 opposes, across the gate insulating film 7, a region of the p-type base region 3 between the $n^-$-type drift region 2 and the $n^+$-type source region 4. An end of the gate electrode 8 toward the source electrode 11 terminates in the trench 6.

An interlayer insulating film 9 is provided on the front surface of the semiconductor substrate 10 and covers the gate electrode 8. The source electrode 11 is in contact with the $n^+$-type source region 4 and the $p^+$-type contact region 5 through a contact hole of the interlayer insulating film 9, and is electrically connected to the $n^+$-type source region 4 and the $p^+$-type contact region 5. The source electrode 11 is electrically insulated from the gate electrode 8 by the interlayer insulating film 9. A drain electrode 12 is provided at the rear surface of the semiconductor substrate 10 overall, and is electrically connected to the $n^+$-type drain region 1.

In the silicon carbide semiconductor device according to the first embodiment depicted in FIG. 1, gate leak current Isg that flows when negative voltage Vgs with respect to the potential of the source electrode 11 is applied to the gate electrode 8 is limited to less than $2 \times 10^{-11}$ A. The gate leak current Isg is Fowler-Nordheim (FN) current that flows as a consequence of holes being injected from the $n^-$-type drift region 2 into the gate insulating film 7 and migrating toward the gate electrode 8 due to electrons passing through the gate insulating film 7 from the gate electrode 8 and tunneling toward the $n^-$-type drift region 2 when high electric field is applied to the gate insulating film 7. Further, the gate leak current Isg is current that passes through locations where insulation of the gate insulating film 7 is lost and flows from the $n^-$-type drift region 2 toward the gate electrode 8.

Under the conditions above, to limit the gate leak current Isg that flows when the negative voltage Vgs relative to the potential of the source electrode 11 is applied to the gate electrode 8, for example, a total area of the gate insulating film 7 in the active region may be set to less than 3.86 mm². The total area of the gate insulating film 7 in the active region is a sum of a mathematical area of a substantially rectangular part of the gate insulating film 7 along both side walls of the trench 6 and a mathematical area of a substantially rectangular part along the bottom of the trench. Therefore, the total area of the gate insulating film 7 in the active region is calculated based on dimensions of the bottom of the trench along the first and the second directions X, Y and a depth d1 of the trench 6.

For example, a surface area of the active region having a substantially rectangular shape in a plan view is assumed to be $A^2$ mm² ($\approx$Amm$\times$Amm), and the MOSFET cell (i.e., the trench 6) is assumed to be disposed at the predetermined cell pitch P1 in a striped layout as viewed from the front surface of the semiconductor substrate 10. In this case, when the cell pitch P1 is assumed to be Dμm, a maximum of (A/D) MOSFET cells may be disposed, where in the MOSFET cell, the depth d1 of the trench 6 is assumed to be Bμm, a width w1 of the bottom of the trench along the second direction Y is assumed to be Cμm, and thickness t1 of the gate insulating film 7 is assumed to be 72 nm. For example, the surface area of the active region is about 60% to 70% of 9 mm² of the semiconductor body; d1 is about 1 μm to 2 μm; w1 is about 0.5 μm to 1 μm; and P1 is about 4 μm to 6 μm.

In other words, a quantity (i.e., quantity of stripes of the trench 6) of the MOSFET cells that may be disposed in the action region may be calculated from the surface area of the active region, a condition of the total area of the gate insulating film 7 in the active region, and the total mathematical area of the gate insulating film 7 in one MOSFET cell. In particular, in a single MOSFET cell, a total length (=2Bμm+Cμm=Eμm) of a length (=d1×2) of the gate insulating film 7 at both side walls of the trench 6 and the length of the gate insulating film 7 (=w1) along the second direction Y at the bottom of the trench is calculated.

The length of the gate insulating film 7 at the side walls of the trench 6 is the depth d1 of the trench 6. A width of the gate insulating film 7 at the bottom of the trench is substantially the width w1 of the bottom of the trench. A width of the bottom of the gate insulating film 7 along the first direction X is equal to a width of one side of the active region and therefore, an upper value (=3.86 mm$^2$/Amm=Fmm) of the total length of the gate insulating film 7 along the second direction Y in the active region is calculated from the condition of the total area of the gate insulating film 7 in the active region and the length of the active region along the first direction X.

The upper value (=Fmm) of the total length of the gate insulating film 7 along the second direction Y in the active region is divided by a total length (=Eμm) of the gate insulating film 7 along the second direction Y in one MOSFET cell, whereby a maximum count (=Fpm/Eμm≈MOSFET cells) of the MOSFET cells that may be disposed in the active region is calculated. Additionally, the length of the active region along the second direction Y is divided by the maximum count of the MOSFET cells that may be disposed in the active region, whereby a maximum value (=Aμm/G MOSFET cells=Dμm) of the cell pitch P1 of the MOSFET cells is calculated.

The depth d1 of the trench 6 and the width w1 of the bottom of the trench may be calculated from the surface area of the active region, the condition of the total area of the gate insulating film 7 in the active region, the cell pitch P1 of the MOSFET cells, and the count of the MOSFET cells disposed in the active region. Further, the gate leak current Isg that flows when the negative voltage Vgs with respect to the potential of the source electrode 11 is applied to the gate electrode 8 is limited to less than $3.7 \times 10^{-6}$ A/m$^2$ (=$2 \times 10^{-11}$ A/$5.42 \times 10^{-6}$ m$^2$) in one unit cell of the MOSFET cell or electrical circuit mounted in the MOSFET cell when converted to per unit area of the active region.

Figure 2:
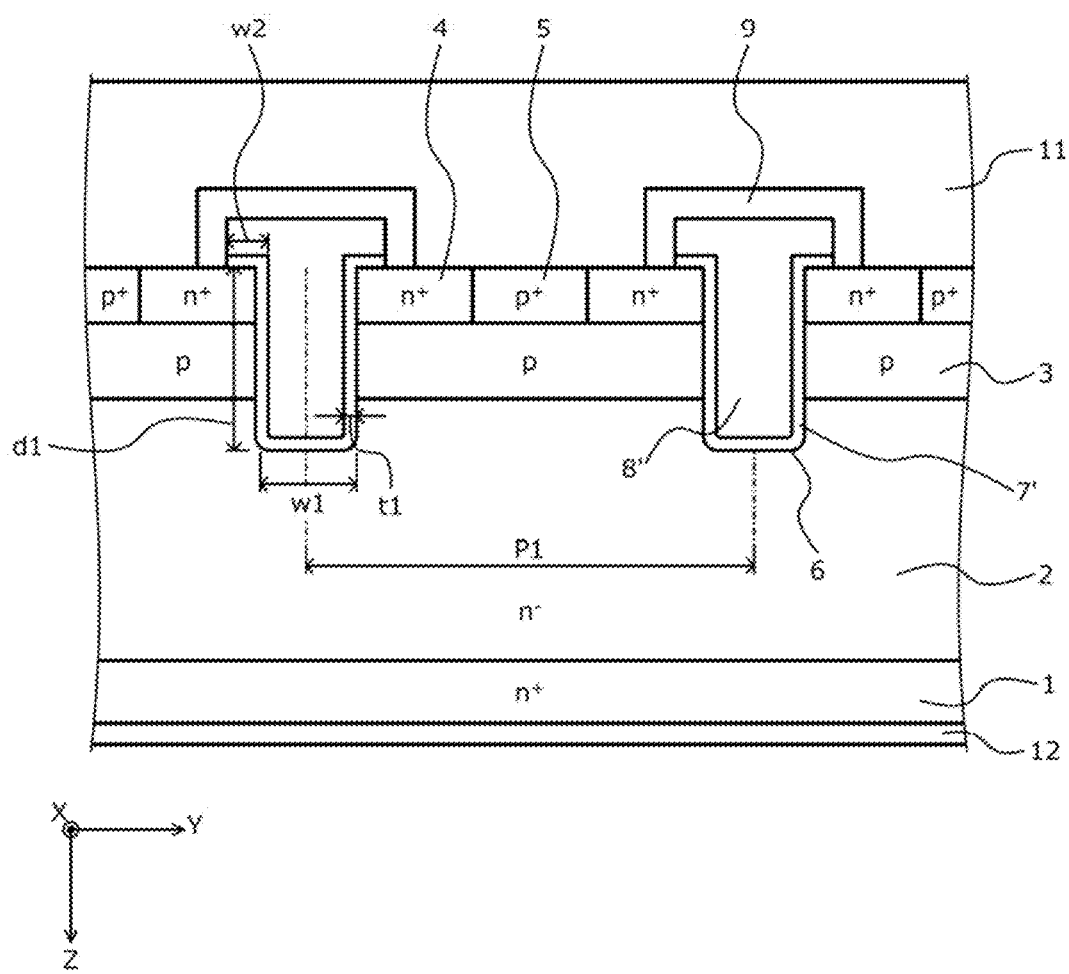
FIG. 2 is a cross-sectional view of another example of the structure of the silicon carbide semiconductor device according to the first embodiment.

FIG. 2 is a cross-sectional view of another example of the structure of the silicon carbide semiconductor device according to the first embodiment. The silicon carbide semiconductor device according to the first embodiment depicted in FIG. 2 differs from the silicon carbide semiconductor device according to the first embodiment depicted in FIG. 1 in that a gate electrode 8' protrudes from inside the trench 6, outwardly beyond the front surface of the semiconductor substrate 10, and an end of the gate electrode 8' toward the source electrode 11 extends onto a top of the front surface of the semiconductor substrate 10. In this case, a gate insulating film 7' is disposed between the front surface of the semiconductor substrate 10 and the gate electrode 8'. In other words, the gate insulating film 7' extends from the side walls of the trench 6 onto the top of the front surface of the semiconductor substrate 10.

In this manner, when the gate insulating film 7' extends onto the top of the front surface of the semiconductor substrate 10, a total mathematical area of the gate insulating film 7' in the active region is a sum of a mathematical area of a substantially rectangular part of the gate insulating film 7' along both side walls of the trench 6, a mathematical area of a substantially rectangular part along the bottom of the trench, and a part on the front surface of the semiconductor substrate 10. Therefore, the total mathematical area of the gate insulating film 7' in the active region is calculated based on widths of the bottom of the trench along the first and the second directions X, Y, the depth d1 of the trench 6, and a width w2 of a part of the gate insulating film 7' on the front surface of the semiconductor substrate 10 along the second direction Y.

Conditions other than the total surface area of the gate insulating film in the active region may be variously changed according to design conditions. Further, while not depicted, in place of the trench gate structure, a planar gate structure may be adopted in which the MOS gate is provided in a plate-like shape on the semiconductor substrate. In a case of the planar gate structure, the gate insulating film is provided along the front surface of the semiconductor substrate, only on the front surface of the semiconductor substrate. The gate insulating film has a substantially rectangular planar shape as viewed from the front surface of the semiconductor substrate. Therefore, the total surface area of the gate insulating film in the active region is a sum of the substantially rectangular planar shaped surface areas of the gate insulating films of all the MOSFET cells.

Further, the negative voltage Vgs that is applied to the gate electrode 8 is limited to be −3V or more relative to the potential of the source electrode 11, whereby a gate leak current Igs that flows when the negative voltage Vgs relative to the potential of the source electrode 11 is applied to the gate electrode 8 may be limited by the conditions above. In this case, when converted to per unit area of the active region, in one unit cell of the MOSFET cell or an electrical circuit mounted in the MOSFET cell, the negative voltage Vgs is limited to 3V or less.

When the thickness t1 of the gate insulating film 7 is 72 nm and the negative voltage Vgs that is applied to the gate electrode 8 is 3V with respect to the potential of the source electrode 11, the electric field applied to the gate insulating film 7 is 0.42 MV/cm (=3V/72 nm) (similarly for that per unit area of the active region). Therefore, in place of limiting the negative voltage Vgs applied to the gate electrode 8 by the conditions above, the electric field applied to the gate insulating film 7 may be limited to 0.42 MV/cm or less. When the electric field (MV/cm) applied to the gate insulating film 7 and the current (A) or current density (A/cm$^2$) is limited to the above conditions or less, the thickness t1 of the gate insulating film 7 may be provided to be thicker than 72 nm.

Figure 3:
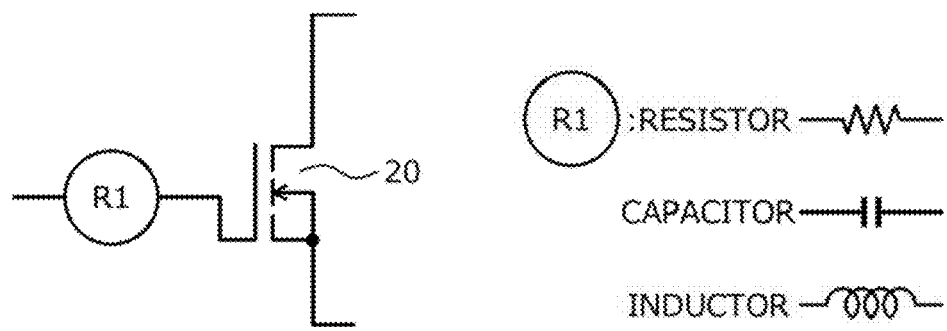
FIG. 3 is a circuit diagram of an example of circuit configuration of the silicon carbide semiconductor circuit device according to the first embodiment.
Figure 4:
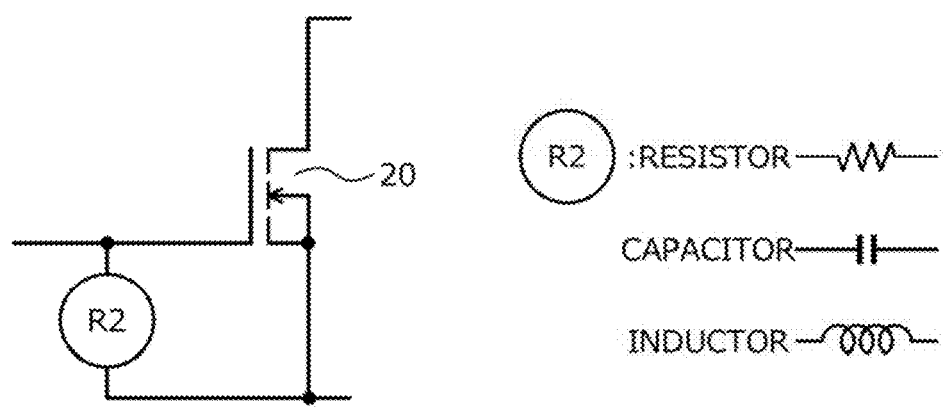
FIG. 4 is a circuit diagram of an example of circuit configuration of the silicon carbide semiconductor circuit device according to the first embodiment.
Figure 5:
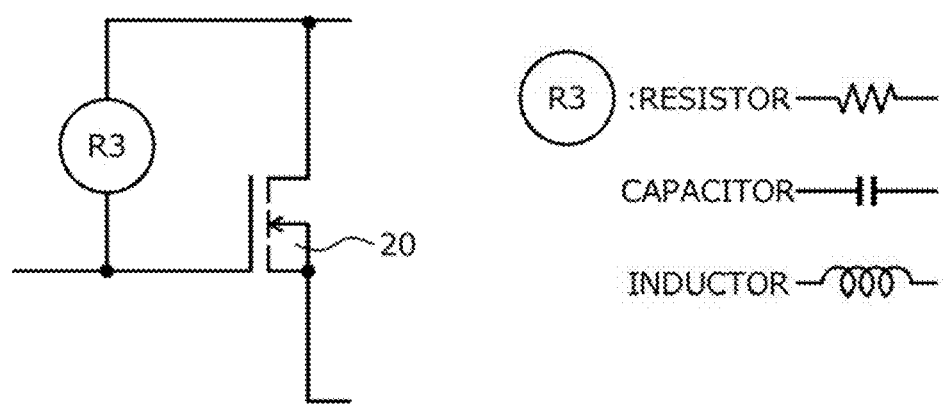
FIG. 5 is a circuit diagram of an example of circuit configuration of the silicon carbide semiconductor circuit device according to the first embodiment.

FIGS. 3, 4, and 5 are circuit diagrams of an example of circuit configuration of the silicon carbide semiconductor circuit device according to the first embodiment. Even with connection of loads R1 to R3 (so-called gate load) such as a resistor functioning as resistance in a gate of a MOSFET 20, a capacitor, or inductor, the gate leak current Isg that flows when the negative voltage Vgs relative to the potential of a source is applied to the gate of the MOSFET 20 or when the negative voltage Vgs relative to the potential of the source is applied to the gate of the MOSFET 20 may be limited by the conditions above. The configurations depicted in FIGS. 3 to 5 are useful for electrical circuits mounted with the MOSFET 20. The MOSFET 20 may have a general configuration.

In particular, the silicon carbide semiconductor circuit device according to the first embodiment may be configured to have the load R1 connected in series to the gate of the MOSFET 20 (FIG. 3), or may be configured to have the load R2 connected in series between a drain and a source of the MOSFET 20 (FIG. 4), or may be configured to have the load R3 connected in series between the gate and a drain of the MOSFET 20 (FIG. 5). The loads R1 to R3 are connected to the gate of the MOSFET 20, reducing a switching speed of the MOSFET 20, whereby ringing of the voltage output and control of the gate leak current Isg during a switching transient period may be reduced.

Figure 6:
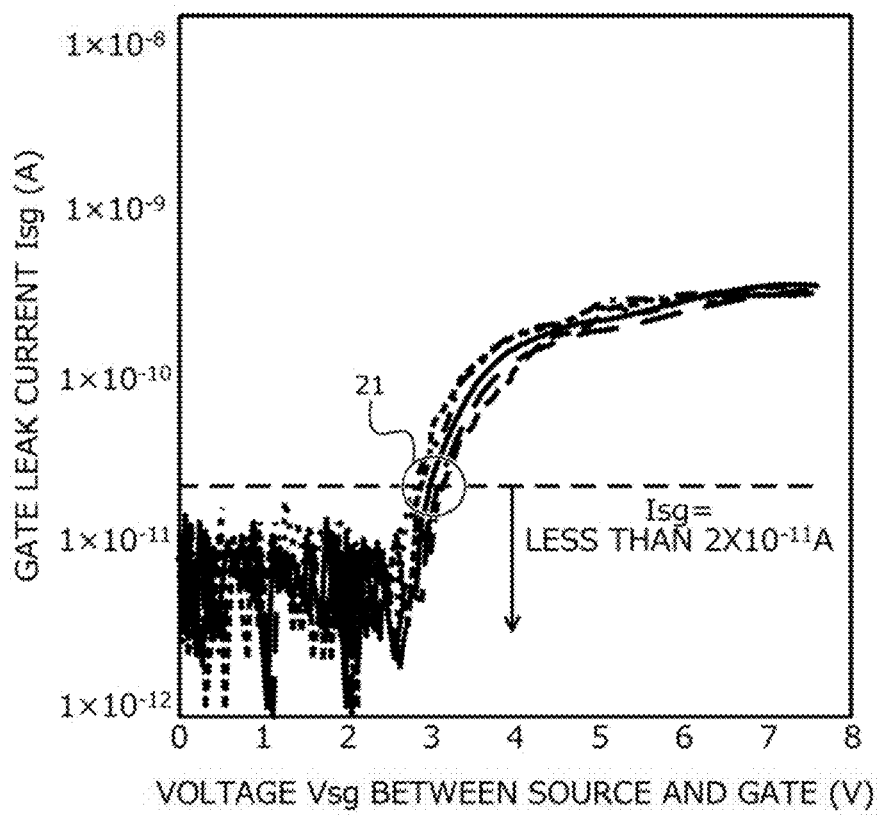
FIG. 6 is a characteristics graph of a relationship of voltage Vsg between a source and a gate, and gate leak current Isg of the silicon carbide semiconductor device according to the first embodiment.

In the silicon carbide semiconductor device according to the first embodiment above, a relationship of positive voltage (in FIG. 6, indicated as "voltage between source and gate") Vsg that is positive with respect to the potential of the gate electrode 8 and applied to the source electrode 11, and the gate leak current Isg that flows at that time was verified. FIG. 6 is a characteristics graph of the relationship of the voltage Vsg between the source and the gate, and the gate leak current Isg of the silicon carbide semiconductor device according to the first embodiment.

With respect to a trench-gate MOSFET (hereinafter, verification example) having a general configuration containing silicon carbide, the positive voltage Vsg relative to the potential of the gate electrode was variously changed and applied to the source electrode; and results of measurement of the gate leak current Isg are depicted in FIG. 6. In FIG. 6, measurement results of plural samples of the verification example are depicted. These plural samples of the verification example assumed a breakdown voltage of 1200V and an avalanche capability was sent within a range from 1500V to 1600V.

Further, the plural samples of the verification example assumed voltage Vds between the drain and the source to be 1200V and leak current Idss between the drain and the source when the gate electrode was assumed to be 0V was set to be within a range from 0.01 μA to 1 mA. Further, the plural samples of the verification example assumed positive voltage (voltage between the drain and the source) Vds relative to the potential of the source electrode and applied to the drain electrode to be 20V and a gate threshold voltage (reference value) Vth when drain current Ids was assumed to be 25 mA was set to be within a range from 4.5V to 5.5V.

Breakdown voltage is a voltage limit at which no damage or errant operation of an element occurs. The avalanche capability is a permissible energy amount that does not lead to destruction even when voltage the transiently exceeds the rated voltage is applied to the MOSFET during startup and shutdown of the MOSFET, in a case of the rated drain current or lower and the rated channel temperature or lower.

From the results depicted in FIG. 6, in all of the samples of the verification example, it was confirmed that when the positive voltage Vsg with respect to the potential of the gate electrode was applied to the source electrode and exceeded 3V, hole injection from the n⁻-type drift region to the gate insulating film started, and accompanying increase of the positive voltage Vsg, the gate leak current Isg increased. In other words, it was confirmed that the voltage that affects threshold variation was 3V and a current value of a rise of the gate leak current Isg at that time was $2 \times 10^{-11}$ A.

In other words, it was confirmed that when the positive voltage Vsg relative to the potential of the gate electrode was 3V or less and applied to the source electrode, the gate leak current Isg did not flow. In the results depicted in FIG. 6, a current waveform of the positive voltage Vsg relative to the potential of the gate electrode and applied to the gate electrode and less 3V was a waveform that occurs due to a detection limit of the measuring equipment and corresponded to the gate leak current Isg being 0 A.

Figure 7:
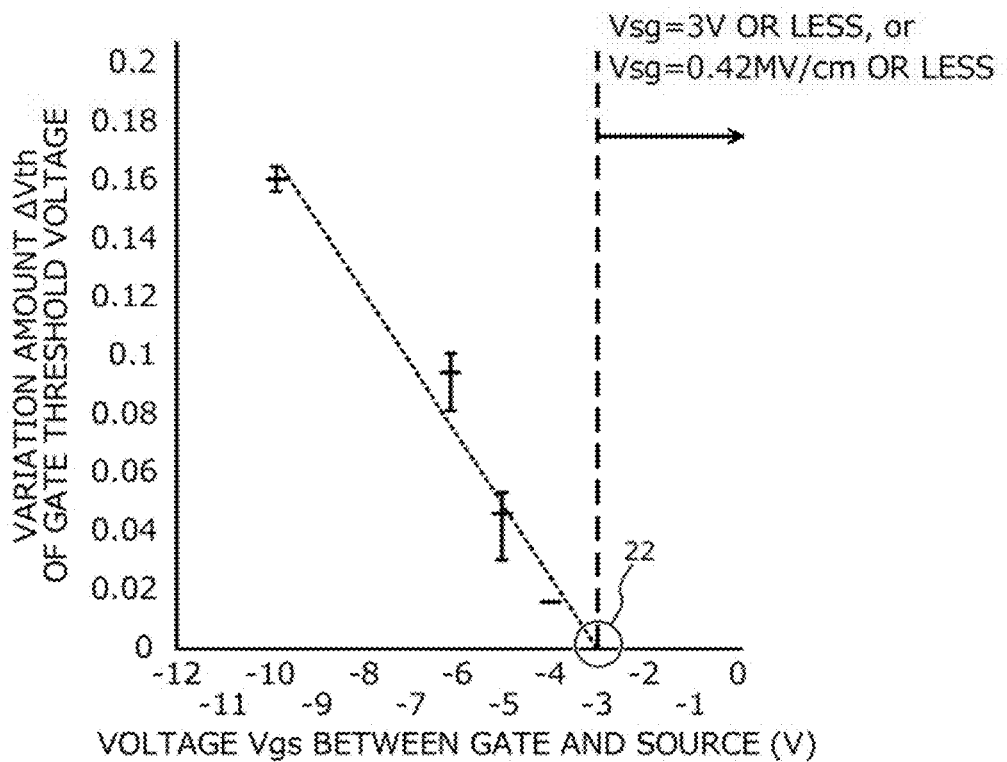
FIG. 7 is a characteristics diagram of a relationship of the voltage Vgs between the gate and the source and a variation amount ΔVth of a gate threshold voltage in the silicon carbide semiconductor device according to the first embodiment.

In the silicon carbide semiconductor device according to the first embodiment above, a relationship of negative voltage (in FIG. 7, indicated as "voltage between gate and source") Vgs relative to the potential of the source electrode 11 and applied to the gate electrode 8 and a variation amount ΔVth of the gate threshold voltage Vth was verified. FIG. 7 is a characteristics diagram of a relationship of the voltage Vgs between the gate and the source and the variation amount ΔVth of the gate threshold voltage in the silicon carbide semiconductor device according to the first embodiment. Variation of the gate threshold voltage is variation from a gate threshold voltage (reference value) at the time of factory shipping, determined based on design conditions.

With respect to the plural samples of the verification example above, the negative voltage Vgs relative to the potential of the source electrode was applied to the gate electrode and variously varied while the gate threshold voltage Vth was measured, and results of calculation of the variation amount ΔVth of the gate threshold voltage Vth are depicted in FIG. 7. In FIG. 7, a horizontal axis indicates test voltage applied in the verification example above in a reliability test while a vertical axis indicates the variation amount ΔVth of the gate threshold voltage Vth in the verification example. Further, in FIG. 7, a linear approximation curve of an average of the variation amount ΔVth of the gate threshold voltage Vth in the plural samples of the verification example is indicated by a finely dotted line.

From the results depicted in FIG. 7, it was confirmed that when the negative voltage Vgs applied to the gate electrode is less than −3V with respect to the potential of the source electrode, the gate threshold voltage Vth varied. Further, it was confirmed that the variation amount ΔVth of the gate threshold voltage Vth increased accompanying decreases of the negative voltage Vgs that was negative relative to the potential of the source electrode and applied to the gate electrode. On the other hand, it was confirmed that when the negative voltage Vgs applied to the gate electrode was −3V or more relative to the potential of the source electrode, the gate threshold voltage Vth did not vary.

In the results depicted in FIG. 7, the negative voltage Vgs applied to the gate electrode being −3V or more relative to the potential of the source electrode coincides with the positive voltage Vsg applied to the gate electrode being 3V or less (part further on right side than dashed line: 0.42 MV/cm or less when converted to electric field applied to the gate insulating film 7) relative to the potential of the source electrode. In other words, from the results depicted in FIG. 7, it was found that limiting the positive voltage Vsg applied to the gate electrode to be 3V or less relative to the potential of the source electrode enables a MOSFET in which the gate threshold voltage Vth does not vary to be provided.

Further, in FIG. 7, the negative voltage Vgs applied to the gate electrode and surrounded by a circle indicated by reference numeral 22 is −3V relative to the potential of the source electrode and a point where the variation amount ΔVth of the gate threshold voltage Vth is zero coincides with a point in FIG. 6 where the positive voltage Vsg applied to the gate electrode and surrounded by a circle indicated by reference numeral 21 is 3V relative to the potential of the source electrode and the gate leak current Isg is $2 \times 10^{-11}$ A. Therefore, from the results depicted in FIGS. 6 and 7, it was found that limiting the gate leak current Isg to be less than $2 \times 10^{-11}$ A enables a MOSFET in which the gate threshold voltage Vth does not vary to be provided.

As described, according to the first embodiment, the gate leak current Isg that flows when the negative voltage Vgs relative to the potential of the source electrode is applied to the gate electrode is set to the described conditions, or positive voltage relative to the potential of the source electrode and applied to the gate electrode is limited to the conditions above. As a result, before FN current flows, the MOSFET may be gate driven, enabling variation of the gate threshold voltage to be suppressed.

Figure 8:
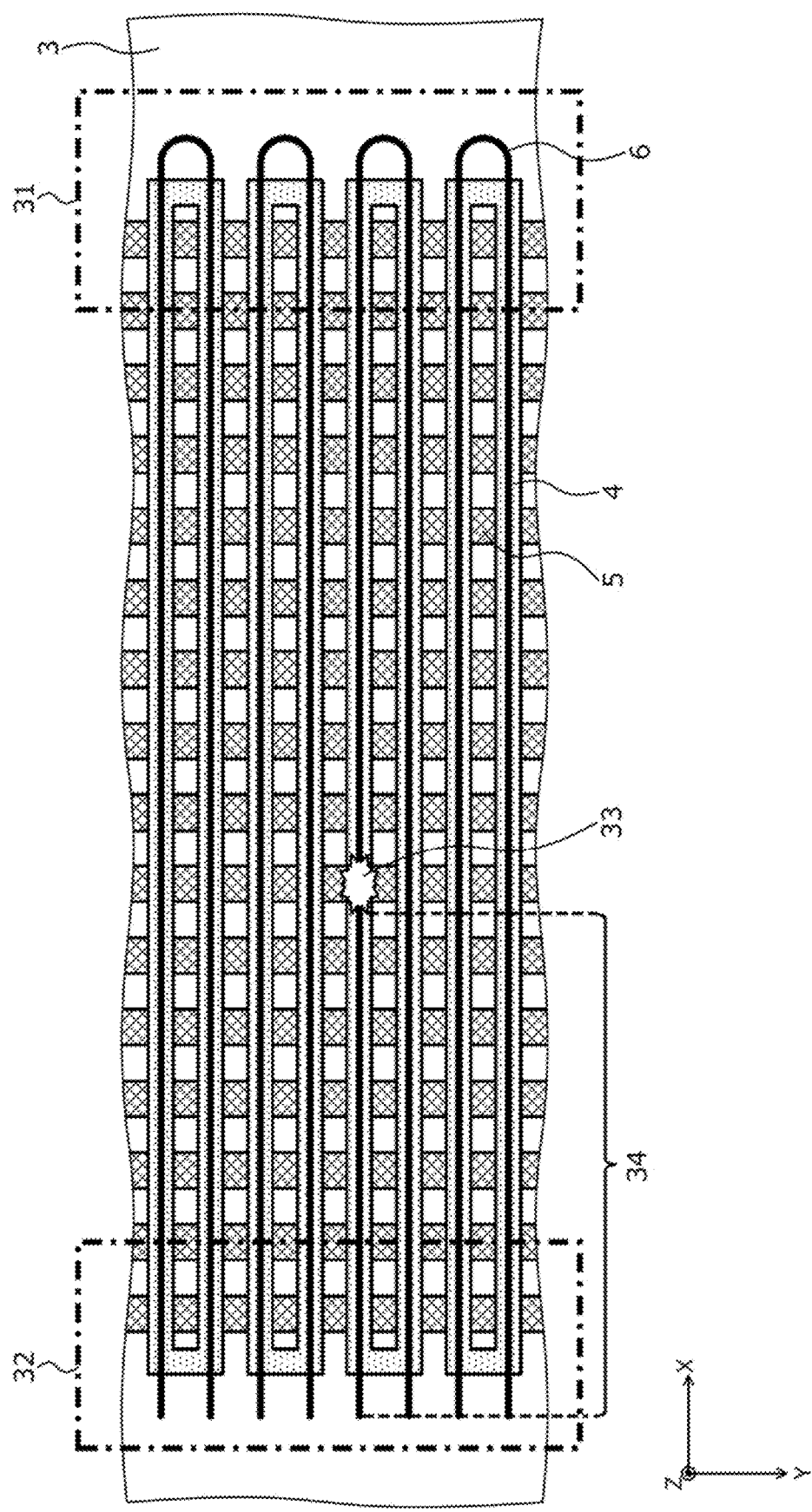
FIG. 8 is a plan view of a layout of a gate electrode of the silicon carbide semiconductor device according to a second embodiment as viewed from a front surface side of a semiconductor substrate.
Figure 9:
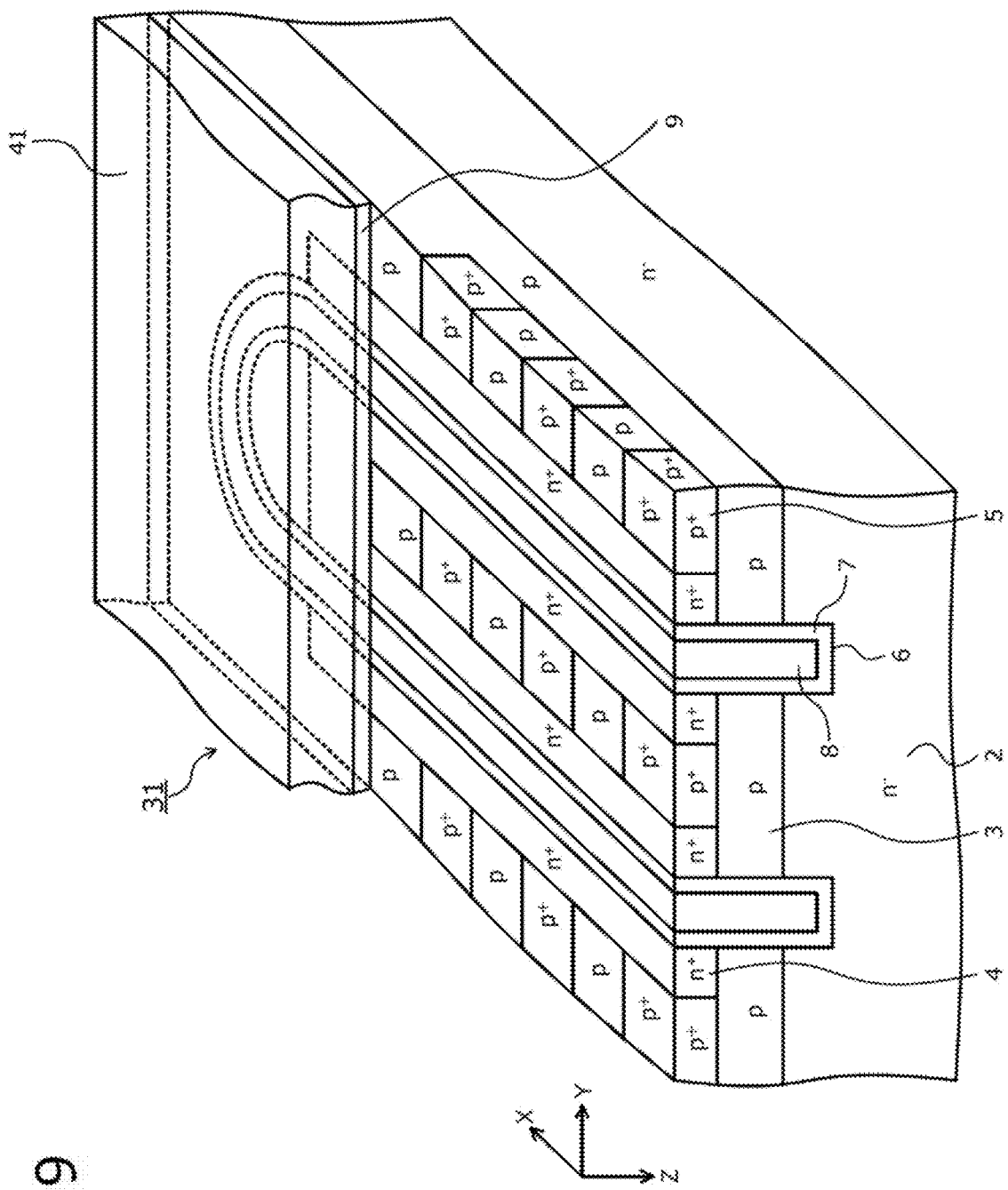
FIG. 9 is a perspective view of a structure of a first end of the gate electrode in FIG. 8.
Figure 10:
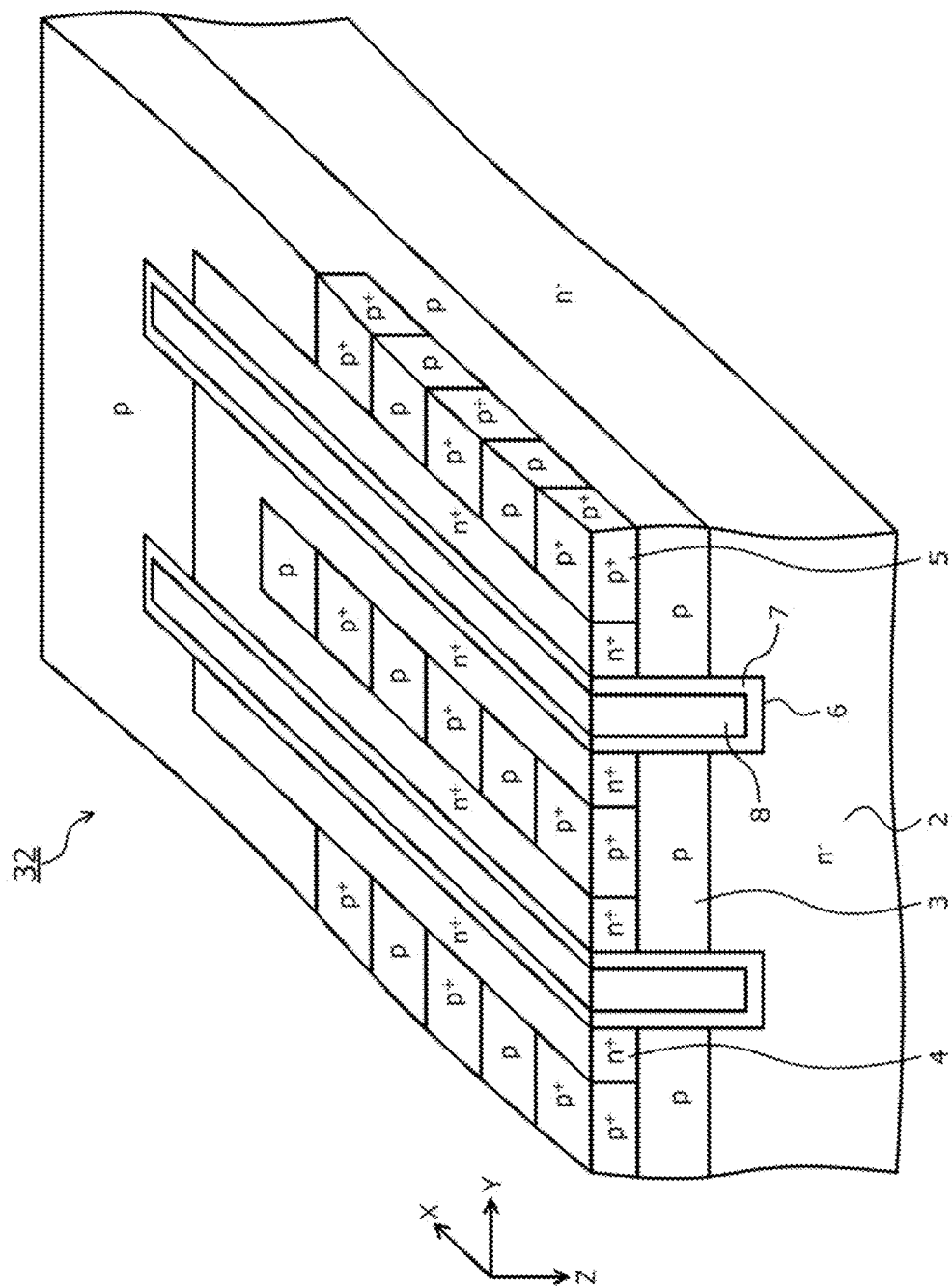
FIG. 10 is a perspective view of a structure of a second end of the gate electrode in FIG. 8.

The silicon carbide semiconductor device according to a second embodiment will be described taking an example of an end structure of the gate electrode of the silicon carbide semiconductor device according to the first embodiment. FIG. 8 is a plan view of a layout of the gate electrode of the silicon carbide semiconductor device according to the second embodiment as viewed from the front surface side of the semiconductor substrate. In FIG. 8, the trench 6 is depicted by a thick line, while the gate insulating film 7 and the gate electrode 8 in the trench 6 are not depicted. FIG. 9 is a perspective view of a structure of a first end of the gate electrode in FIG. 8. FIG. 10 is a perspective view of a structure of a second end of the gate electrode in FIG. 8. In FIG. 9, a structure of the gate electrode 8 near a coupled end 31 thereof is depicted. In FIG. 10, a structure of the gate electrode 8 near a non-coupled end 32 thereof is depicted.

The silicon carbide semiconductor device according to the second embodiment depicted in FIG. 8 has a structure in which the gate electrodes 8 that are adjacent to each other and extend parallel to the first direction X have a planar shape that is a U-shape where the first ends 31 opposing each other in the second direction Y are coupled to each other, and the second ends 32 opposing each other in the second direction Y are positioned separated from each other. In particular, the trench 6, as described in the first embodiment, is disposed in a striped layout extending along the first direction X. Ends of the trench 6, for example, extend to an edge termination region. Two of the trenches 6 that are adjacent to each other and extend along the first direction X in a linear shape, form a planar shape that is a U-shape where first ends of the trenches 6 opposing each other in the second direction Y are coupled to each other, and second ends of the trenches 6 opposing each other in the second direction Y are positioned separated from each other.

In the trench 6, the gate electrode 8 containing, for example, poly-silicon (poly-Si) is provided via the gate insulating film 7. The gate electrodes 8 in the trenches 6, similarly to the two trenches 6 in which the gate electrodes 8 are embedded, form a planar shape that is a U-shape where the first ends 31 opposing each other in the second direction Y are coupled to each other, and the second ends 32 opposing each other in the second direction Y are positioned separated from each other. The coupled ends 31 of the gate electrodes 8 are connected to a gate runner 41. Therefore, gate potential of the gate electrodes 8 is drawn from the outside to the gate electrodes 8 from the coupled ends 31 (FIG. 9). The non-coupled ends 32 of the gate electrodes 8 are not connected to the gate runner 41. The gate potential is not drawn from the non-coupled ends 32 of the gate electrodes 8 (FIG. 10).

The edge termination region surrounds a periphery of the active region. In other words, the edge termination region is a region between the active region and a side surface of the semiconductor substrate 10. The edge termination region has a function of mitigating electric field of the n$^-$-type drift region 2 on the front surface side of the semiconductor substrate 10 and maintaining the breakdown voltage. In particular, in the edge termination region, a breakdown voltage structure such as a field limiting ring (FLR), a mesa structure, a junction termination extension (JTE) structure, a field plate, etc. is disposed. Further, in the edge termination region, a gate pad and the gate runner 41 are disposed.

The gate runner 41 is provided in the edge termination region, on the front surface of the semiconductor substrate 10, via the interlayer insulating film 9 and is electrically connected to a non-depicted gate pad. The gate runner 41 opposes the coupled ends 31 of the gate electrodes 8 across the interlayer insulating film 9, in a depth direction Z. The gate runner 41 is connected to the coupled ends 31 of the gate electrodes 8, via non-depicted contact hole of the interlayer insulating film 9. Provided the gate runner 41 and the non-coupled ends 32 of the gate electrodes 8 are electrically insulated from each other, a layout of the gate runner 41 may be variously modified. In place of the gate runner 41, a gate finger described hereinafter may be disposed.

For example, the gate runner 41 may be disposed in a substantially rectangular layout surrounding a periphery of the active region. In this case, no contact hole is formed between the gate runner 41 and the non-coupled ends 32 of the gate electrodes 8, whereby the gate runner 41 and the non-coupled ends 32 of the gate electrodes 8 are electrically insulated from each other by the interlayer insulating film 9. Further, the gate runner 41 may be disposed in a layout surrounding a periphery of the active region, in a substantially U-shape that does not oppose the non-coupled ends 32 of the gate electrodes 8 in the depth direction Z, or may be disposed in a substantially linear layout opposing only the coupled ends 31 of the gate electrodes 8, in the depth direction Z.

The gate insulating film 7, for example, is a deposited film such as a high temperature oxide (HTO) film. The gate insulating film 7 may be a single layer film of only the deposited film or may be a stacked film having the deposited film as one layer. The n$^+$-type source region 4 is provided to be in contact with both side walls of the trench 6 and extends along both side walls of the trench 6, along the first direction X. An end of the n$^+$-type source region 4, for example, terminates in the active region and is not provided at the ends 31, 32 of the trench 6. The n$^+$-type source regions 4 that are respectively in contact with the two trenches 6 whose first ends are coupled to each other may form a substantially rectangular planar shape in which first ends that oppose each other in the second direction Y and are coupled to each other, and second ends that oppose each other in the second direction Y are coupled to each other.

The p$^+$-type contact region 5 is provided in plural between (mesa region) the trenches 6 that are adjacent to each other, at a predetermined interval in the first direction X. A part of the mesa region excluding the n$^+$-type source region 4 and the p$^+$-type contact region 5 is the p-type base region 3. In other words, in a single mesa region, between the n$^+$-type source regions 4 that are adjacent to each other, the p-type base region 3 and the p$^+$-type contact region 5 are disposed to repeatedly alternate in the first direction X. The p$^+$-type contact regions 5 disposed in mutually differing mesa regions oppose each other across the trench 6, in the second direction Y. Further, the p$^+$-type contact regions 5 are in contact with the n$^+$-type source regions 4 that are disposed in the same mesa region as the p$^+$-type contact regions 5, and the p$^+$-type contact regions 5 are disposed further from the trenches 6 than the n$^+$-type source regions 4.

As described, only the coupled ends 31 of the gate electrodes 8 are connected to the gate runner 41 and only from the coupled ends 31 of the gate electrodes 8 is the gate potential drawn to the gate electrodes 8. Therefore, when there is a disconnection 33 at one site of the gate electrodes 8 due to a formation failure or the like (refer to FIGS. 16 and 17) of the trench 6, a part 34 that is a part of the gate electrodes 8 from the site of the disconnection 33 to the non-coupled ends 32 and that is not connected to the gate runner 41 due to the disconnection 33 has a floating potential. As a result, when voltage between the drain and the source is applied, at the part 34 of the gate electrode 8 having a floating potential due to the disconnection 33, a leak defect occurs, enabling detection of the disconnection 33 of the gate electrode 8.

Figure 11:
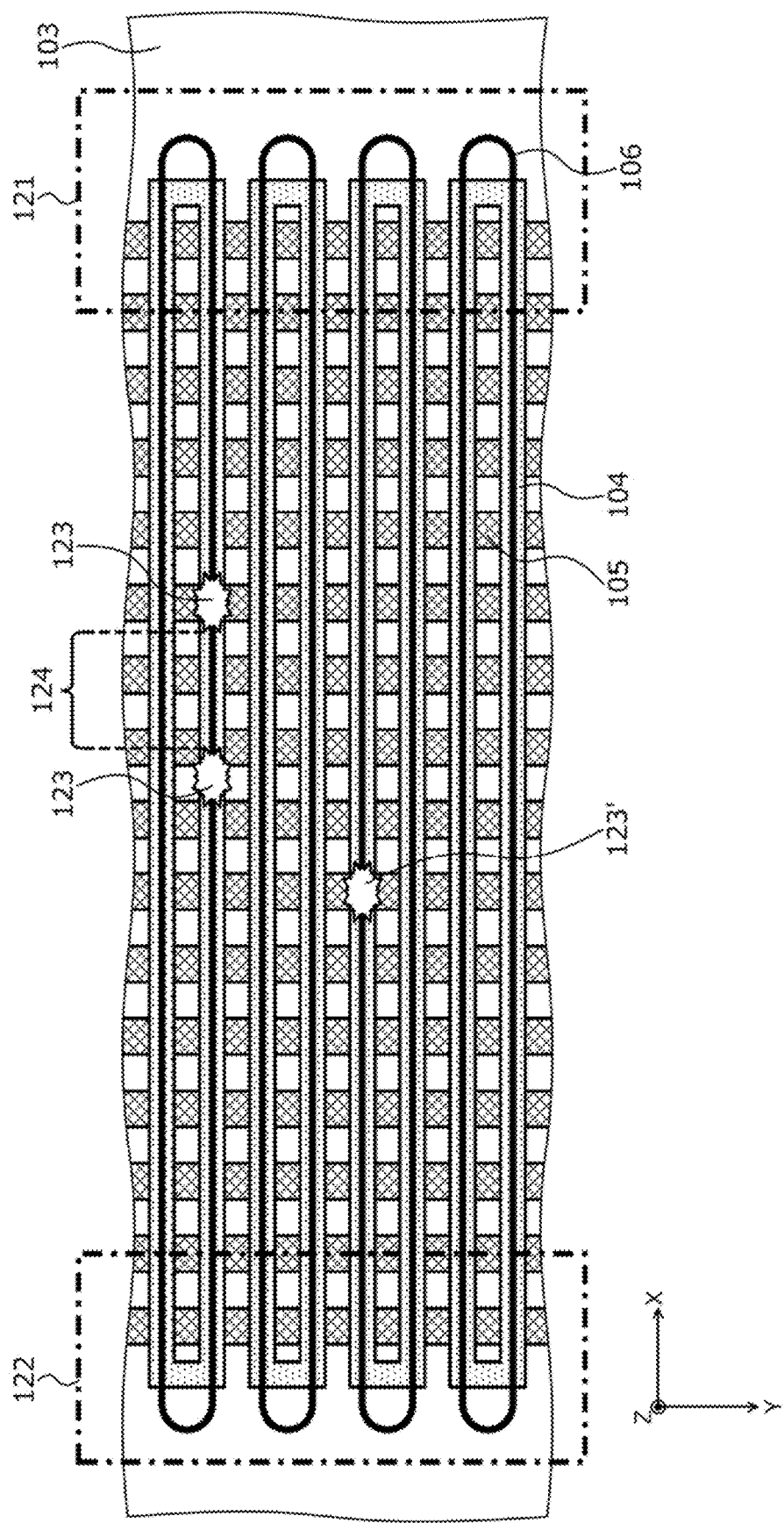
FIG. 11 is a plan view of a layout of a gate electrode of a conventional silicon carbide semiconductor device as viewed from a front surface side of a semiconductor substrate.
Figure 12:
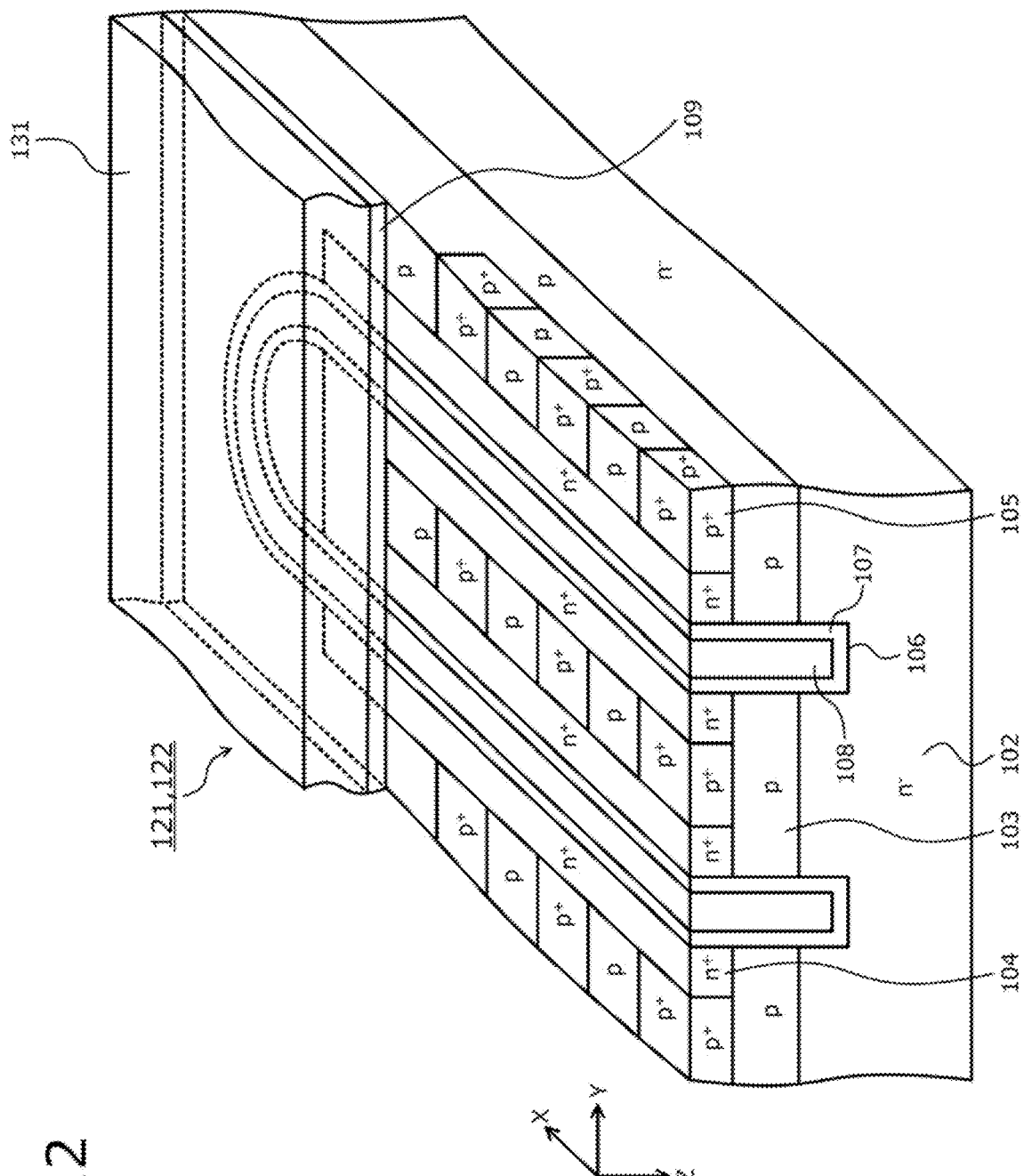
FIG. 12 is a perspective view of a structure of an end of the gate electrode in FIG. 11.
Figure 13:
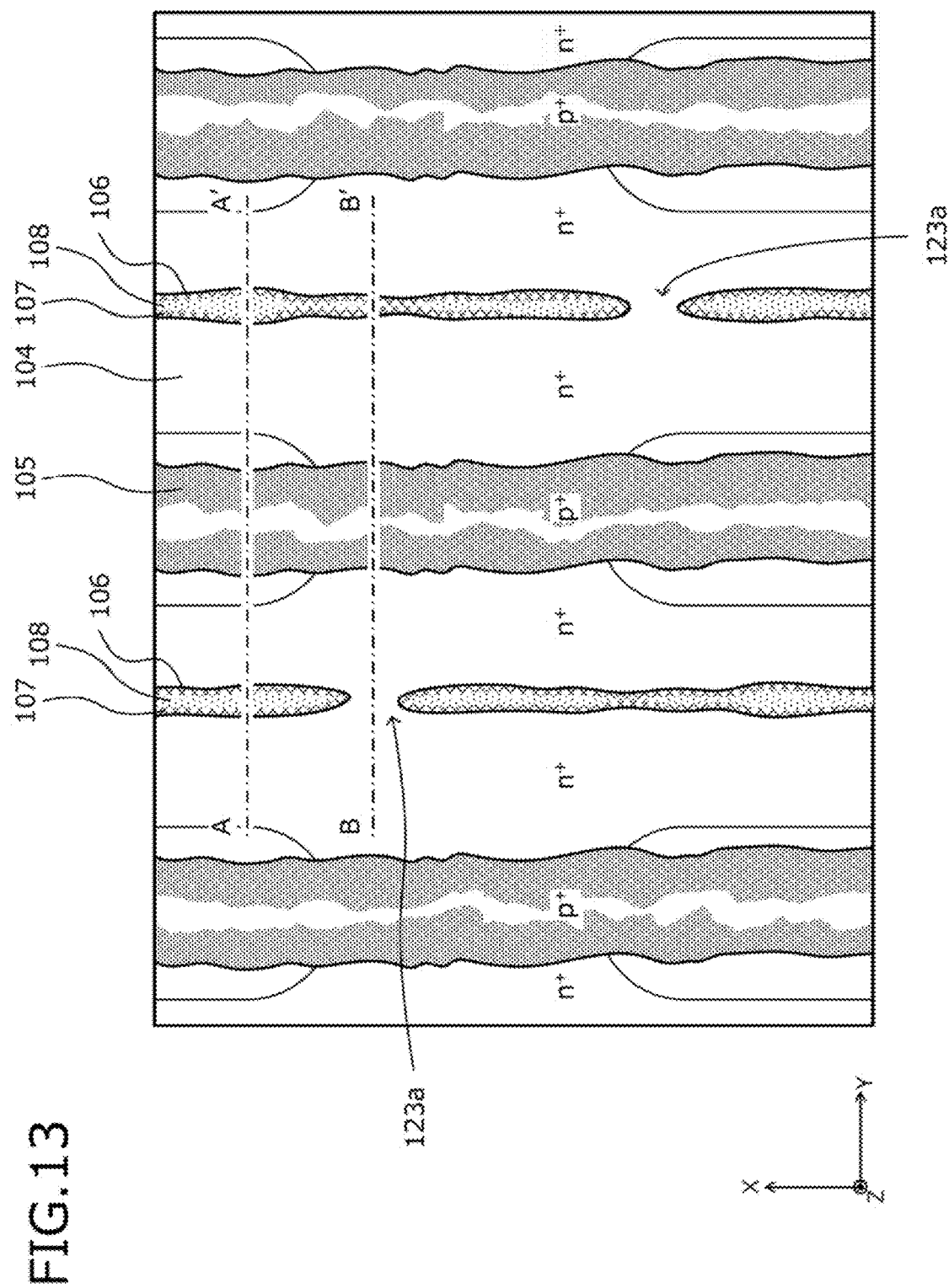
FIG. 13 is a plan view of an example of disconnection sites in the gate electrode depicted in FIG. 11.
Figure 14:
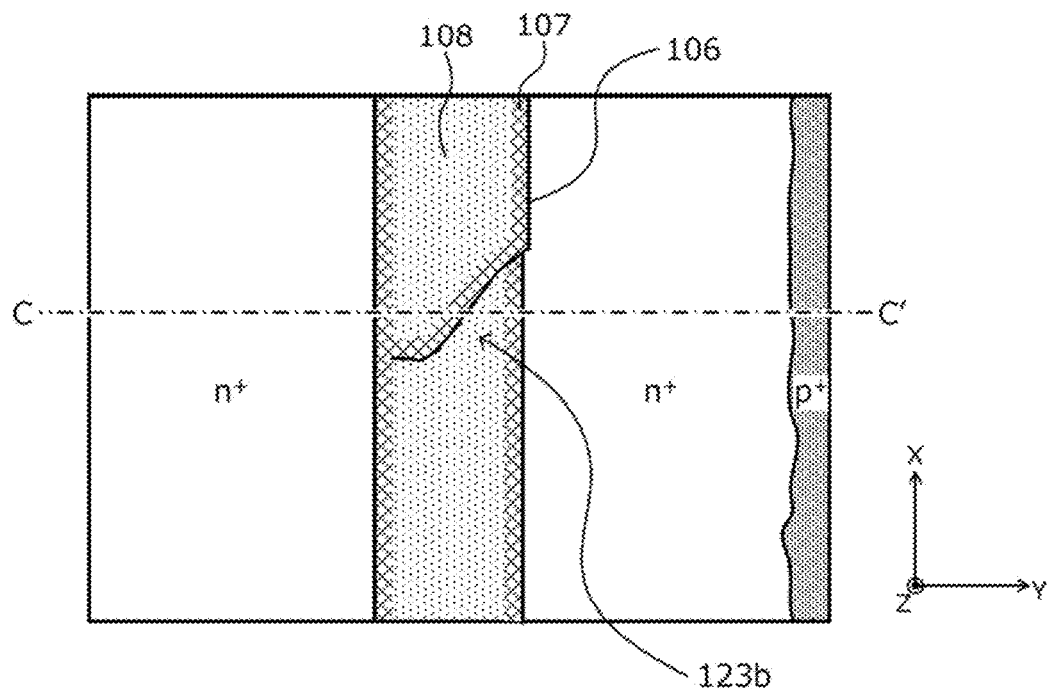
FIG. 14 is a plan view of an example of disconnection sites in the gate electrode depicted in FIG. 11.
Figure 15:
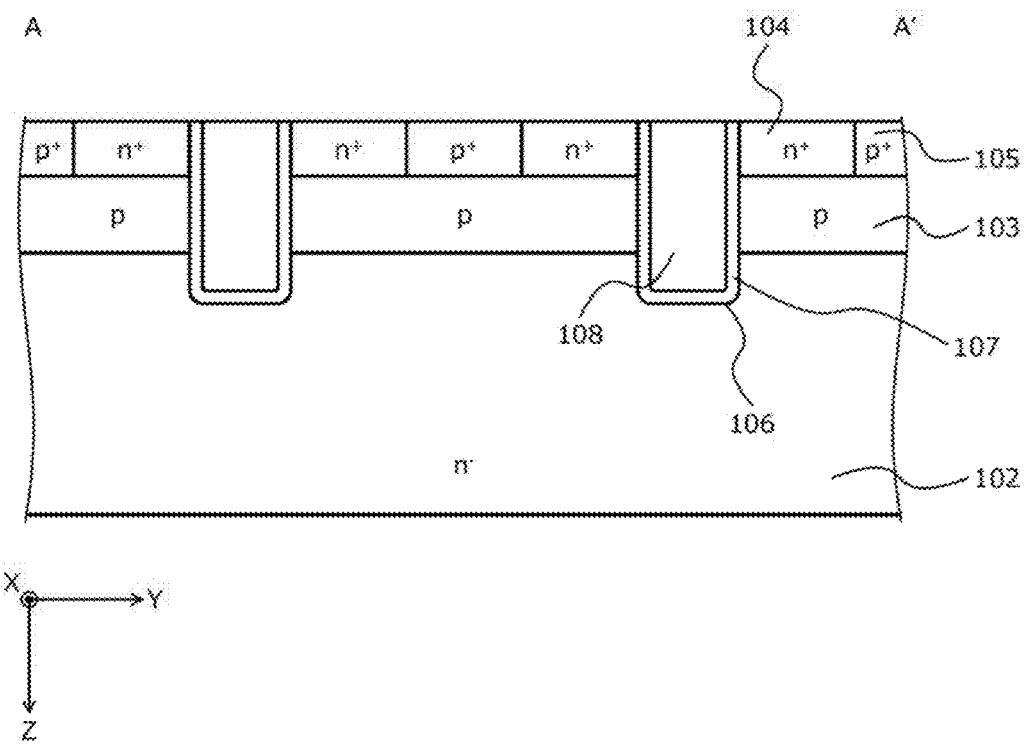
FIG. 15 is a cross-sectional view of a structure at cutting line A-A' in FIG. 13.

For example, in a conventional structure, when a disconnection occurs at a part of a gate electrode, the following problem occurs. FIG. 11 is a plan view of a layout of the gate electrode of a conventional silicon carbide semiconductor device as viewed from a front surface side of a semiconductor substrate. In FIG. 11, a trench 106 is indicated by a thick line, while a gate insulating film 107 and a gate electrode 108 in the trench 106 is not depicted. FIG. 12 is a perspective view of a structure of an end of the gate electrode in FIG. 11. FIGS. 13, 14 are plan views of an example of disconnection sites in the gate electrode depicted in FIG. 11. FIG. 15 is a cross-sectional view of the structure at cutting line A-A' in FIG. 13. FIG. 16 is a cross-sectional view of the structure at cutting line B-B' in FIG. 13. FIG. 17 is a cross-sectional view of the structure at cutting line C-C' in FIG. 14.

The silicon carbide semiconductor device depicted in FIGS. 11 and 12, similarly to the silicon carbide semiconductor device according to the first embodiment, is a vertical MOSFET that has a MOS gate having a trench gate structure in which the gate electrode 108 is provided, via the gate insulating film 107, in the trench 106 that is disposed in a striped layout extending along the first direction X. In FIGS. 11 and 12, reference numerals 102, 103, 104, and 105 are an n$^-$-type drift region, a p-type base region, an n$^+$-type source region, and a p$^+$-type contact region, respectively. Two of the trenches 106 that are adjacent to each other and extend along the first direction X in a linear shape, form a planar shape that is a closed ring-shape where first ends that oppose each other in the second direction Y are coupled to each other and second ends that oppose each other in the second direction Y are coupled to each other.

The gate electrodes 108 embedded, via the gate insulating films 107, in the two trenches 106 having respective ends coupled to each other, similarly to the two trenches 106 in which the gate electrodes 108 are embedded, form a planar shape that is a closed ring-shape where first ends 121 that oppose each other in the second direction Y are coupled and second ends 122 that oppose each other in the second direction Y are coupled. The respective coupled ends 121, 122 of the gate electrodes 108 are connected to a gate runner 131 via a non-depicted contact hole of an interlayer insulating film 109. In other words, gate potential is drawn from the outside to the respective gate electrodes 108 from the respective coupled ends 121, 122 of the gate electrodes 108.

In the conventional silicon carbide semiconductor device depicted in FIGS. 11 and 12, when a disconnection 123 occurs at two sites in one gate electrode 108 having a ring planar shape, a part 124 that is a part of the gate electrode 108 between the sites of the disconnections 123 and that is not connected to the gate runner 131 due to the disconnections 123 has a floating potential, thereby enabling detection of the disconnections 123 of the gate electrode 108. On the other hand, when a disconnection 123' of the gate electrode 108 occurs at only one site, the gate electrode 108 forms a planar shape having a ring-shape opened at one part and is continuous, whereby the gate electrode 108 overall is at the gate potential and therefore, the device operates similarly as in a case where the disconnection 123' has not occurred in the gate electrode 108.

In this manner, in the conventional silicon carbide semiconductor device, when the disconnection 123' of the gate electrode 108 occurs at only one site, the device operates and therefore, the disconnection 123' of the gate electrode 108 is not detectable by a reliability test or the like, whereby the device having a defect and degraded reliability slips out into the market. Causes of the disconnections 123, 123' of the gate electrode 108 include formation defects of the trench 106. A formation defect of the trench 106 is a formation abnormality of the trench 106 occurring due to, for example, a part of the trench 106 that extends linearly along the first direction X not being formed (reference character 123$a$ in FIGS. 13 and 16), the trench 106 that extends along the first direction X being shallow at a part 106' (reference character 123$b$ in FIGS. 14 and 17), and the like.

Of the above formation abnormalities of the trench 106, in the case of the trench 106 being shallow at the part 106', when the gate insulating film 107 is formed by thermal oxidation and there is formation abnormality in the trench 106, the gate insulating film 107 also has a formation abnormality. Therefore, the disconnection 123$b$ of the gate electrode 108 is detectable by a screening test of the gate insulating film 107. On the other hand, when the gate insulating film 107 is a deposited film such as a HTO film, even if there is a formation abnormality in the trench 106, the gate insulating film 107 is formed having a uniform thickness along the inner wall of the trench 106 and therefore, the disconnection 123$b$ of the gate electrode 108 is undetectable by a screening test of the gate insulating film 107.

In contrast, in the present invention, even in a case where the gate insulating film 7 is a deposited film such as a HTO film, when the disconnection 33 occurs at one site of the gate electrode 8 due to a formation defect of the trench 6 as described, the part 34 of the gate electrode 8 has a floating potential. Therefore, by an application of the maximum rated voltage between the drain and the source, punch-through occurs at the part 34 of the gate electrode 8 having the floating potential. Here, a case where the leak current Idss between the drain and the source exceeds a specified value is detected as a leak defect, enabling the MOSFET to be judged as defective. In this manner, the disconnection 33 of the gate electrode 8 is detectable, and a device having a defect and degraded reliability may be prevented from slipping out into the market.

As described, the second embodiment is applicable to the first embodiment.

Figure 18:
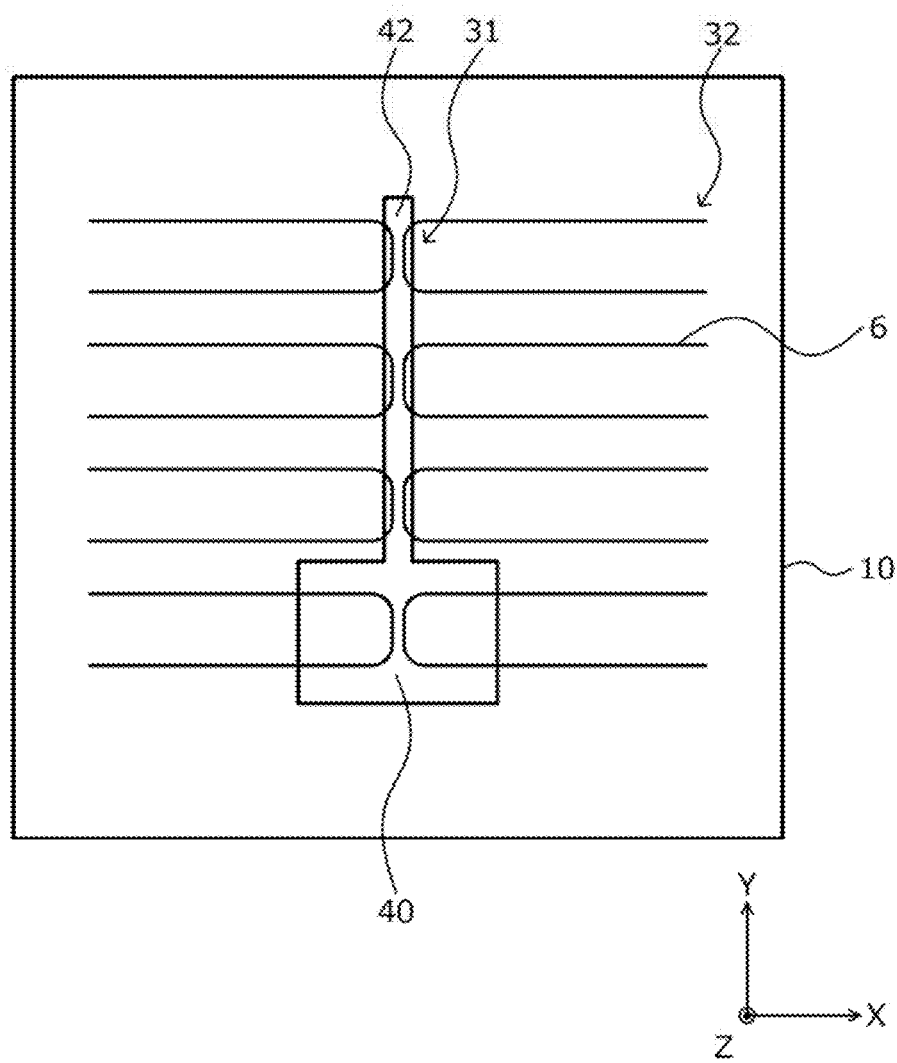
FIG. 18 is a plan view of an example of a layout of a MOS gate of the silicon carbide semiconductor device according to a third embodiment as viewed from the front surface side of the semiconductor substrate.
Figure 19:
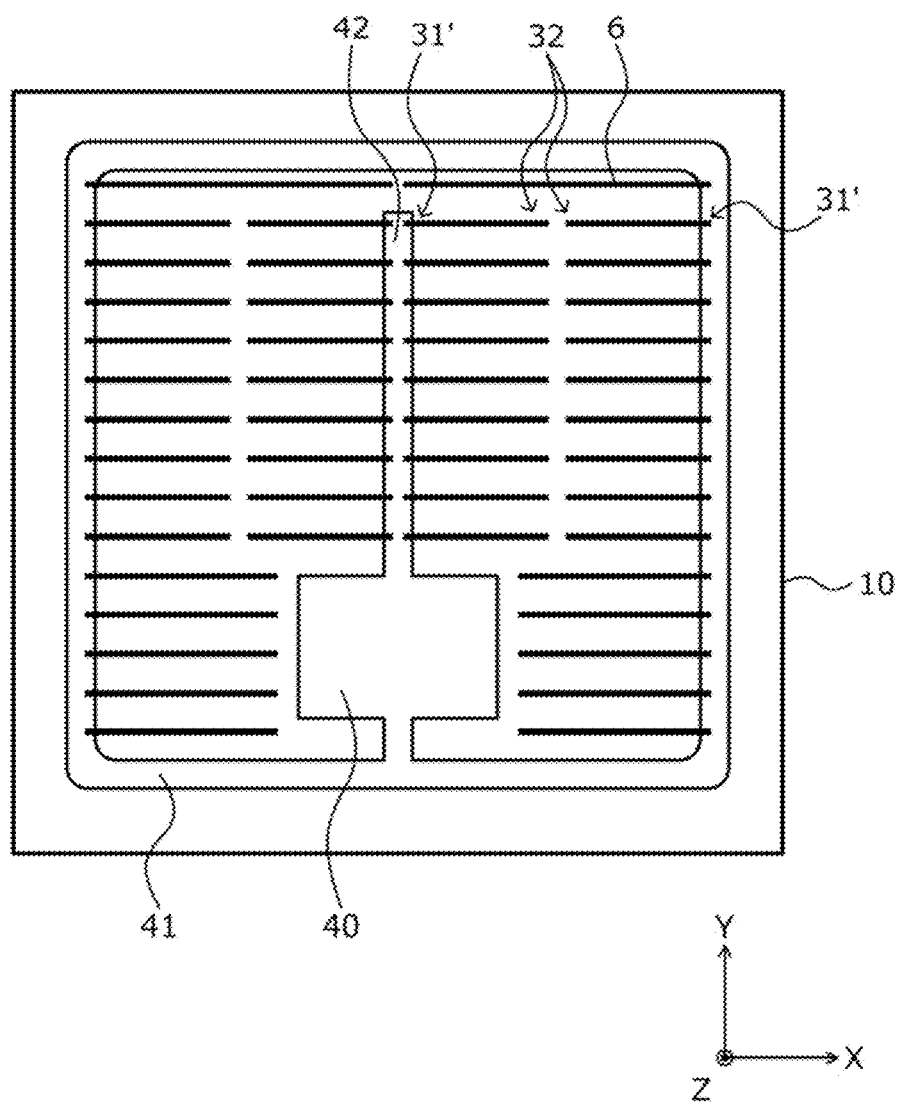
FIG. 19 is a plan view of an example of a layout of a MOS gate of the silicon carbide semiconductor device according to a third embodiment as viewed from the front surface side of the semiconductor substrate.
Figure 20:
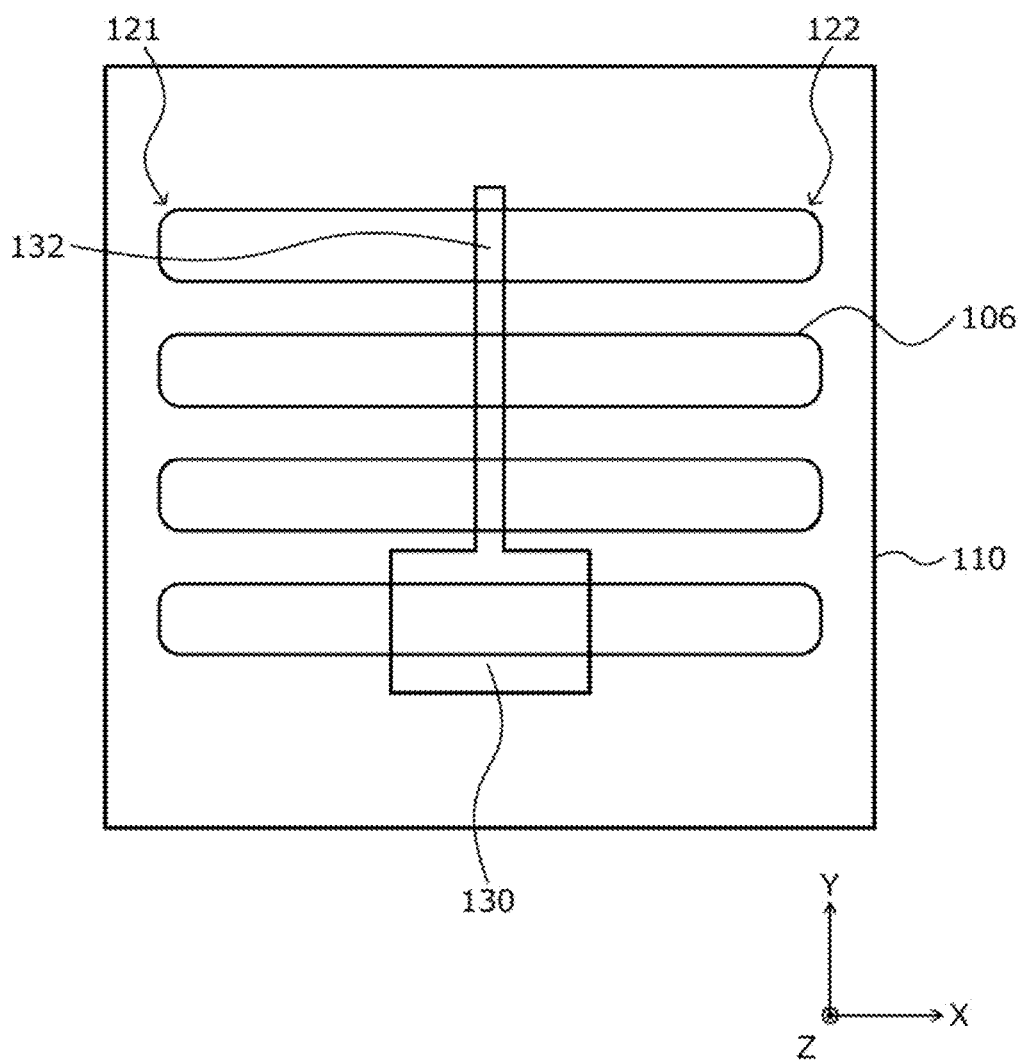
FIG. 20 is a plan view of an example of a layout of a MOS gate of the conventional silicon carbide semiconductor device as viewed from the front surface side of the semiconductor substrate.

The silicon carbide semiconductor device according to a third embodiment will be described taking an example of a layout of the gate electrode 8 of the silicon carbide semiconductor device according to the second embodiment. FIGS. 18 and 19 are plan views of examples of a layout of the MOS gate of the silicon carbide semiconductor device according to the third embodiment as viewed from the front surface side of the semiconductor substrate. In FIGS. 18 and 19, the gate insulating film 7 and the gate electrode 8 in the trench 6 are not depicted. FIG. 20 is a plan view of an example of a layout of the MOS gate of the conventional silicon carbide semiconductor device as viewed from the front surface side of the semiconductor substrate. In FIG. 20, the gate insulating film and the gate electrode in the trench 106 are not depicted. FIG. 20 is FIG. 2 of Japanese Laid-Open Patent Publication No. 2016-129226.

The silicon carbide semiconductor device according to the third embodiment depicted in FIG. 18 includes a gate finger 42 and a gate pad 40 provided on the front surface of the semiconductor substrate 10, via the interlayer insulating film. The gate pad 40, for example, has a substantially rectangular planar shape. The gate finger 42, for example, is provided at a substantially central part of the semiconductor substrate 10, and extends along the second direction Y in a linear planar shape. The gate finger 42 is coupled to the gate pad 40 and is at the gate potential. The plural trenches 6 are disposed in a striped layout extending along the first direction X, and have coupled ends that oppose the gate pad 40 or the gate finger 42 in the depth direction Z, and have non-coupled ends positioned toward a side surface of the semiconductor substrate 10.

The coupled ends of the trenches 6 opposing the gate pad 40 or the gate finger 42 in the depth direction Z are parts only for establishing a contact between the gate electrode 8 (refer to FIG. 9) and the gate pad 40 or the gate finger 42. In other words, the coupled ends 31 of the gate electrodes 8 in the trenches 6 are connected to the gate pad 40 or the gate finger 42, via a contact hole of a non-depicted interlayer insulating film. The $n^+$-type source region 4 is not disposed at the coupled ends of the trenches 6. Therefore, a vicinity of the coupled ends of the trenches 6 opposing the gate pad 40 or the gate finger 42 in the depth direction Z does not operate as the MOSFET. The non-coupled ends 32 of the gate electrodes 8 are not connected to the gate pad 40 or to the gate finger 42.

Disposal of the trenches 6 may be variously modified. For example, as depicted in FIG. 18, at a part where the coupled ends of the trenches 6 are separated from each other and the coupled ends of the trenches 6 oppose the gate pad 40 or the gate finger 42 in the depth direction Z, the trenches 6 may be disposed extending along the first direction X so as to face each other along the first direction X. Further, only the first ends 31' of the gate electrodes 8 are connected to the gate pad 40 or the gate finger 42 via a contact hole of the non-depicted interlayer insulating film. Therefore, as depicted in FIG. 19, the trenches 6 have first ends (the first ends 31' of the gate electrodes 8) that oppose each other in the second direction Y and second ends (the second ends 32 of the gate electrodes 8) that oppose each other in the second direction Y and that need not be coupled to each other. In this case, the gate runner 41 may be disposed so as to surround a periphery of the active region.

When the gate runner 41 is disposed, the trenches 6 are disposed so that only the first ends oppose the gate pad 40, the gate runner 41, or the gate finger 42 in the depth direction Z. For example, as depicted in FIG. 19, at a part where the first ends (the first ends 31' of the gate electrodes 8) of the trenches 6 are separated from each other and the first ends of the trenches 6 oppose the gate finger 42 in the depth direction Z, the trenches 6 extending along the first direction X may be disposed so as to oppose each other along the first direction X. Additionally, the second ends (the second ends 32 of the gate electrodes 8) of these trenches 6 and the second ends (the second ends 32 of the gate electrodes 8) of the other trenches 6 oppose each other along the first direction X, and the other trenches 6 extending along the first direction X may be disposed so that the first ends (the first ends 31' of the gate electrodes 8) of the other trenches 6 oppose the gate runner 41 in the depth direction Z.

On the other hand, in the conventional silicon carbide semiconductor device depicted in FIG. 20, the trenches 106 that extend along the first direction X are disposed so that the coupled ends (the coupled ends 121, 122 of the gate electrode 108 (refer to FIG. 12)) of the trenches 106 are positioned near both side surfaces that constitute opposite sides of a semiconductor substrate 110. Disposal of a gate pad 130 or a gate finger 132 is similar to that in the silicon carbide semiconductor device according to the third embodiment depicted in FIG. 18. In other words, the gate pad 130, for example, has a substantially rectangular planar shape. The gate finger 132, for example, is provided at a substantially central part of the semiconductor substrate 110, and extends along the second direction Y to have a linear planar shape. The gate finger 132 is coupled to the gate pad 130 and is at the gate potential. Therefore, the trenches 106 each opposes the gate pad 130 or the gate finger 132 in the depth direction Z at a central part that is in the middle between both of the ends.

In other words, in the conventional structure, at the central part of the trench 106, the gate electrode 108 in the trench 106 is connected to the gate pad 130 or the gate finger 132, via a contact hole in the non-depicted interlayer insulating film. At a part of the trench 106 excluding the coupled ends, an $n^+$-type source region 104 (refer to FIG. 12) is provided along side walls of the trench 106. Therefore, at the central parts of the trenches 106, the $n^+$-type source region 104 is disposed along the side walls of the trenches 106, and the central parts of the trenches 106 opposing the gate pad 130 or the gate finger 132 in the depth direction Z also operate as the MOSFET. Therefore, in the conventional structure, even when the disconnection 123' (refer to FIG. 11) occurs at one site of the gate electrode 108, a part of the gate electrode 108 cannot be caused to have a floating potential.

As described, the third embodiment is applicable to the first and the second embodiments.

The present invention is not limited to the embodiments above and various modifications within a range not departing from the spirit of the present invention are possible. For example, in the embodiments above, while a vertical MOSFET having a trench gate structure has been described as an example, the present invention is further applicable in a case of a planar gate structure in place of the trench gate structure, a case of a MOS semiconductor device such as an insulated gate bipolar transistor (IGBT) in place of the MOSFET, and a case of a horizontal semiconductor device in place of the vertical semiconductor device. Further, the present invention is similarly implemented when conductivity types (n-type, p-type) are reversed.

The silicon carbide semiconductor device and the silicon carbide semiconductor circuit device according to the embodiments of the present invention achieve an effect in that a gate may be driven before FN current flows, thereby enabling variation of the gate threshold voltage to be suppressed.

As described, the silicon carbide semiconductor device and the silicon carbide semiconductor circuit device according to the embodiments of the present invention is useful in semiconductor devices having a MOS gate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A silicon carbide semiconductor device, comprising:
   a first-conductivity-type semiconductor layer of a first conductivity type;
   a first semiconductor region of a second conductivity type provided on one side of the first-conductivity-type semiconductor layer;
   a second semiconductor region of the first conductivity type, provided on another side of the first-conductivity-type semiconductor layer;
   a third semiconductor region of the first conductivity type selectively provided in the first semiconductor region;

a gate insulating film provided in contact with a region of the first semiconductor region between the first-conductivity-type semiconductor layer and the third semiconductor region;

a gate electrode provided on an inner side of the gate insulating film, the first semiconductor region being provided on an outer side of the gate insulating film across from the gate electrode;

a first electrode electrically connected to the first semiconductor region and the third semiconductor region; and a second electrode electrically connected to the second semiconductor region, wherein the gate insulating film has a total mathematical area of less than 3.86 mm$^2$ such that a gate leak current that flows when a negative voltage is applied to the gate electrode is limited to less than $2\times10^{-11}$A, the negative voltage being negative relative to a potential of the first electrode.

2. The silicon carbide semiconductor device according to claim 1, wherein the gate leak current is limited to less than $3.7\times10^{-6}$A/m$^2$.

3. The silicon carbide semiconductor device according to claim 1, wherein a positive voltage applied to the first electrode is limited in magnitude to 3V or lower relative to a potential of the gate electrode.

4. The silicon carbide semiconductor device according to claim 3, wherein an electric field applied to the gate insulating film is limited to 0.42 MV/cm or lower.

5. The silicon carbide semiconductor device according to claim 3, wherein a thickness of the gate insulating film is thicker than 72 nm.

6. The silicon carbide semiconductor device according to claim 1, wherein the gate insulating film is a deposited film or a stacked film having the deposited film as one layer, the gate electrode is disposed in a striped layout extending along a first direction parallel to the first main surface of the first-conductivity-type semiconductor layer, and the gate electrode has a first end fixed at a gate potential and a second end at a floating potential.

7. The silicon carbide semiconductor device according to claim 6, wherein the gate electrode is disposed in plural, in a layout in which the first ends of the gate electrodes are adjacent to each other in a second direction that is orthogonal to the first direction and are coupled to each other and the second ends of the gate electrodes are adjacent to each other in the second direction and are positioned separated from each other.

8. The silicon carbide semiconductor device according to claim 6, wherein the deposited film is a high temperature oxide film.

9. The silicon carbide semiconductor device according to claim 1, wherein the gate electrode contains polysilicon.

10. The silicon carbide semiconductor device according to claim 1, wherein the gate electrode is provided in a trench which penetrates the third semiconductor region and the first semiconductor region to extend into the first-conductivity-type semiconductor layer, and the gate insulating film is provided along opposite side walls of the trench and a bottom of the trench.

11. The silicon carbide semiconductor device according to claim 10, wherein the total mathematical area of the gate insulating film is calculated based on dimensions of the bottom of the trench and a depth of the trench.

12. A silicon carbide semiconductor device, comprising:

a first-conductivity-type semiconductor layer of a first conductivity type;

a first semiconductor region of a second conductivity type provided on one side of the first-conductivity-type semiconductor layer;

a second semiconductor region of the first conductivity type, provided on another side of the first-conductivity-type semiconductor layer;

a third semiconductor region of the first conductivity type selectively provided in the first semiconductor region;

a gate insulating film provided in contact with a region of the first semiconductor region between the first-conductivity-type semiconductor layer and the third semiconductor region;

a gate electrode provided on an inner side of the gate insulating film, the first semiconductor region being provided on an outer side of the gate insulating film across from the gate electrode;

a first electrode electrically connected to the first semiconductor region and the third semiconductor region; and a second electrode electrically connected to the second semiconductor region, wherein the gate insulating film has a thickness thicker than 72 nm that a negative voltage applied to the gate electrode is limited to −3V or higher relative to a potential of the first electrode.

13. The silicon carbide semiconductor device according to claim 12, wherein the gate insulating film is configured to have a total mathematical area in an active region of the silicon carbide semiconductor device such that when the negative voltage applied to the gate electrode is limited to −3V or higher relative to the potential of the first electrode, a variation in an amount of a gate threshold voltage is approximately zero.

14. The silicon carbide semiconductor device according to claim 12, wherein the gate insulating film is configured to have a total mathematical area in an active region of the silicon carbide semiconductor device such that when the negative voltage applied to the gate electrode is limited to −3V or higher relative to the potential of the first electrode, an electric field applied to the gate insulating film is limited to 0.42 MV/cm or less.

15. A silicon carbide semiconductor circuit device, comprising:

a silicon carbide semiconductor device that includes:

a first-conductivity-type semiconductor layer of a first conductivity type;

a first semiconductor region of a second conductivity type provided on one side of the first-conductivity-type semiconductor layer;

a second semiconductor region of the first conductivity type, provided on another side of the first-conductivity-type semiconductor layer;

a third semiconductor region of the first conductivity type selectively provided in the first semiconductor region;

a gate insulating film provided in contact with a region of the first semiconductor region between the first-conductivity-type semiconductor layer and the third semiconductor region;

a gate electrode provided on an inner side of the gate insulating film, the first semiconductor region being provided on an outer side of the gate insulating film across from the gate electrode;

a first electrode electrically connected to the first semiconductor region and the third semiconductor region; and a second electrode electrically connected to the second semiconductor region, wherein the gate insulating film has a total mathematical area of less than 3.86 mm$^2$ such that a gate leak current that flows when a negative voltage is applied to the gate electrode is limited to less than $2\times10^{-11}$A, the negative voltage being negative relative to a potential of the first electrode, and the gate leak current is limited by a load connected to the gate electrode.

16. The silicon carbide semiconductor circuit device according to claim 15, wherein the load is a resistor, a capacitor, or an inductor.

17. The silicon carbide semiconductor circuit device according to claim 15, wherein the silicon carbide semiconductor circuit device further comprises the load, the load is a resistor, a capacitor, or an inductor, and the load is connected to a gate of the silicon carbide semiconductor circuit device.

18. The silicon carbide semiconductor circuit device according to claim 17, wherein the load is connected in series between the gate and a source of the silicon carbide semiconductor circuit device, or the load is connected in series between the gate and the drain of the silicon carbide semiconductor circuit device.

* * * * *

UNITED STATES PATENT AND TRADEMARK OFFICE
CERTIFICATE OF CORRECTION

PATENT NO. : 10,840,340 B2  
APPLICATION NO. : 16/254834  
DATED : November 17, 2020  
INVENTOR(S) : Keiji Okumura et al.

Page 1 of 1

It is certified that error appears in the above-identified patent and that said Letters Patent is hereby corrected as shown below:

In the Claims

Column 18, Line 34 (approx.) In Claim 12, before "that" insert -- such --.

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*